(12) United States Patent
Iwami et al.

(10) Patent No.: US 9,960,572 B2
(45) Date of Patent: *May 1, 2018

(54) SEMICONDUCTOR DEVICE

(71) Applicant: FURUKAWA ELECTRIC CO., LTD., Tokyo (JP)

(72) Inventors: Masayuki Iwami, Tokyo (JP); Hirotatsu Ishii, Tokyo (JP); Norihiro Iwai, Tokyo (JP); Takeyoshi Matsuda, Tokyo (JP); Akihiko Kasukawa, Tokyo (JP); Takuya Ishikawa, Tokyo (JP); Yasumasa Kawakita, Tokyo (JP); Eisaku Kaji, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/235,756

(22) Filed: Aug. 12, 2016

(65) Prior Publication Data
US 2016/0351392 A1 Dec. 1, 2016

Related U.S. Application Data

(63) Continuation of application No. PCT/JP2015/057093, filed on Mar. 11, 2015.

(30) Foreign Application Priority Data

Mar. 11, 2014 (JP) ................. 2014-047339

(51) Int. Cl.
*H01S 5/343* (2006.01)
*H01L 29/778* (2006.01)
(Continued)

(52) U.S. Cl.
CPC .... *H01S 5/34313* (2013.01); *H01L 21/02576* (2013.01); *H01L 29/045* (2013.01);
(Continued)

(58) Field of Classification Search
CPC .......... H01S 5/34313–5/3432; H01S 5/32358; H01L 31/03046; H01L 29/66439;
(Continued)

(56) References Cited

U.S. PATENT DOCUMENTS 4,047,123 A * 9/1977 Kirkby ................ H01S 5/32308
257/190
4,670,176 A 6/1987 Morioka et al.
(Continued)

FOREIGN PATENT DOCUMENTS

JP 51-60487 5/1976
JP 5640996 B2 * 9/1981 ............. H01S 5/227
(Continued)

OTHER PUBLICATIONS

Tansu et al., "Current Injection Efficiency of InGaAsN Quantum-Well Lasers", Feb. 9, 2005, Journal of Applied Physics, 97, 054502, 1-18.*

(Continued)

*Primary Examiner* — Joshua King
(74) *Attorney, Agent, or Firm* — Oblon, McClelland, Maier & Neustadt, L.L.P.

(57) ABSTRACT

A semiconductor device includes a semiconductor layer formed of a III-V group semiconductor crystal containing As as a primary component of a V group. A V group element other than As has been introduced at a concentration of 0.02 to 5% into a V group site of the III-V group semiconductor crystal in the semiconductor layer.

2 Claims, 11 Drawing Sheets

(51) Int. Cl.
*H01L 29/201* (2006.01)
*H01L 29/868* (2006.01)
*H01S 5/227* (2006.01)
*H01S 5/30* (2006.01)
*H01L 29/04* (2006.01)
*H01L 29/205* (2006.01)
*H01L 31/0304* (2006.01)
*H01L 31/036* (2006.01)
*H01L 31/105* (2006.01)
*H01L 29/36* (2006.01)
*H01S 5/32* (2006.01)
*H01S 5/22* (2006.01)
*H01L 21/02* (2006.01)

(52) U.S. Cl.
CPC ........ *H01L 29/201* (2013.01); *H01L 29/205* (2013.01); *H01L 29/7784* (2013.01); *H01L 29/7787* (2013.01); *H01L 29/868* (2013.01); *H01L 31/036* (2013.01); *H01L 31/03046* (2013.01); *H01L 31/105* (2013.01); *H01S 5/227* (2013.01); *H01S 5/309* (2013.01); *H01S 5/3086* (2013.01); *H01S 5/3434* (2013.01); *H01S 5/34373* (2013.01); *H01L 21/02546* (2013.01); *H01L 21/02609* (2013.01); *H01L 29/36* (2013.01); *H01S 5/2224* (2013.01); *H01S 5/32* (2013.01)

(58) Field of Classification Search
CPC ........ H01L 2924/13046; H01L 29/868; H01L 31/075; H01L 31/105; H01L 31/1055; H01L 33/012
See application file for complete search history.

(56) References Cited

U.S. PATENT DOCUMENTS

| | | | |
|---|---|---|---|
| 4,682,196 A * | 7/1987 | Sakai | H01L 31/035281 257/458 |
| 5,226,053 A | 7/1993 | Cho | |
| 5,260,959 A | 11/1993 | Hayakawa | |
| 5,617,437 A * | 4/1997 | Fukunaga | B82Y 20/00 372/45.01 |
| 5,661,742 A | 8/1997 | Huang et al. | |
| 6,472,691 B2 * | 10/2002 | Mukaihara | H01S 5/1228 257/115 |
| 6,621,842 B1 * | 9/2003 | Dapkus | B82Y 20/00 372/45.01 |
| 6,912,237 B2 * | 6/2005 | Ohkubo | B82Y 20/00 372/43.01 |
| 2001/0006840 A1 * | 7/2001 | Takahashi | B82Y 10/00 438/483 |
| 2003/0007766 A1 * | 1/2003 | Galarza | G02B 6/1228 385/132 |
| 2003/0013223 A1 | 1/2003 | Ramdani | |
| 2003/0013224 A1 * | 1/2003 | Shimizu | B82Y 20/00 438/47 |
| 2003/0043872 A1 | 3/2003 | Yokozeki | |
| 2004/0066818 A1 * | 4/2004 | Yamamoto | B82Y 20/00 372/45.01 |
| 2004/0094760 A1 | 5/2004 | Taylor | |
| 2004/0135136 A1 * | 7/2004 | Takahashi | B82Y 20/00 257/14 |
| 2005/0041708 A1 * | 2/2005 | Fujishiro | B82Y 20/00 372/45.011 |
| 2005/0056868 A1 * | 3/2005 | Gentner | B82Y 20/00 257/222 |
| 2007/0029542 A1 | 2/2007 | Yamada | |
| 2007/0051939 A1 | 3/2007 | Nakahara | |
| 2007/0052048 A1 * | 3/2007 | Hoke | H01L 29/7785 257/431 |
| 2011/0164641 A1 | 7/2011 | Yoshida | |
| 2016/0352075 A1 * | 12/2016 | Iwami | H01S 5/227 |

FOREIGN PATENT DOCUMENTS

| | | |
|---|---|---|
| JP | 60-200900 | 10/1985 |
| JP | 62-186524 | 8/1987 |
| JP | 4-88690 | 3/1992 |
| JP | 5-235470 | 9/1993 |
| JP | 7-283482 | 10/1995 |
| JP | 2001-102355 A | 4/2001 |
| JP | 2012-146996 | 8/2012 |

OTHER PUBLICATIONS

Yuen et al., "Improved Optical Quality of GaNAsSb in the Dilute Sb Limit", May 25, 2005, Journal of Applied Physics, 97, 113510, 1-5.*

International Search Report dated Jun. 2, 2015 in PCT/JP2015/057093, filed on Mar. 11, 2015 ( with English Translation).

Written Opinion dated Jun. 2, 2015 in PCT/JP2015/057093, filed on Mar. 11, 2015.

NuoFu Chen et al. "Excess Arsenic in GaAs Grown at Low Temperatures by Molecular Beam Epitaxy", Journal of Applied Physics, vol. 35, 1996, 3 pages.

U.S. Office Action dated Feb. 27, 2017 in corresponding U.S. Appl. No. 15/235,685.

* cited by examiner

SEMICONDUCTOR DEVICE

CROSS-REFERENCE TO RELATED APPLICATION

This application is a continuation of PCT International Application No. PCT/JP2015/057093 filed on Mar. 11, 2015 which claims the benefit of priority from Japanese Patent Application No. 2014-047339 filed on Mar. 11, 2014, the entire contents of which are incorporated herein by reference.

BACKGROUND

1. Field of the Invention

The present disclosure relates to a semiconductor device.

2. Description of the Related Art

In a semiconductor device such as a semiconductor laser element, characteristics are deteriorated in accordance with electrification. For example, it is known that catastrophic optical damage (COD) occurs on an edge in an edge emission type laser element. As a technology for preventing COD, a window structure for suppressing absorption of laser light on an edge is known (refer to Japanese Laid-open Patent Publication No. 2012-146996).

In deterioration of characteristics of a semiconductor device, deterioration due to deterioration of an edge thereof has received an attention. Therefore, countermeasures to the deterioration of characteristics of a semiconductor element have been developed around a technology to protect an edge of a semiconductor device.

However, according to studies by the present inventors, defects to cause deterioration of characteristics may be generated not only on an edge of a semiconductor device but also in a bulk of a semiconductor crystal in accordance with higher output or higher breakdown voltage of the semiconductor device. For example, the present inventors have confirmed that a dislocation loop not caused by an edge is generated and the dislocation loop is grown in a bulk in an active layer of a semiconductor laser element or in the vicinity thereof. This tendency is significant particularly in a high output element having an optical power of about several tens W or more at one chip.

There is a need for a semiconductor device suppressing generation of defects in a bulk of a semiconductor crystal and having less variation of characteristics.

SUMMARY

A semiconductor device includes a semiconductor layer formed of a III-V group semiconductor crystal containing As as a primary component of a V group, and a V group element other than As has been introduced at a concentration of 0.02 to 5% into a V group site of the III-V group semiconductor crystal in the semiconductor layer.

The above and other objects, features, advantages and technical and industrial significance of this invention will be better understood by reading the following detailed description of presently preferred embodiments of the invention, when considered in connection with the accompanying drawings.

DETAILED DESCRIPTION

Figure 1:
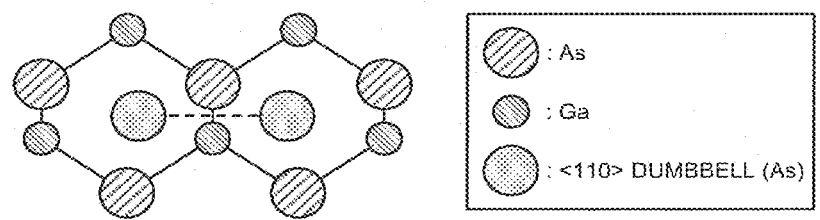
FIG. 1 is a schematic diagram illustrating a <110> dumbbell formed between GaAs crystal lattices.

Hereinafter, embodiments of the present disclosure will be described with reference to the drawings. In all the drawings of the embodiments below, the same sign is given to the same portion or a corresponding portion. The present disclosure is not limited by the embodiments described below. The drawings are schematic, and it should be taken into consideration that a relation between sizes of elements or the like may be different from an actual one. A mutual relation in size or ratio may be different between the drawings.

First, in order to make the present disclosure understood easily in describing embodiments of the present disclosure, intensive studies performed by the present inventors in order to solve the above problem will be described.

Gallium arsenide (GaAs) or aluminum arsenide (AlAs) is used as an example of a semiconductor crystal below. However, implementation of the present disclosure is not limited to these examples, but the present disclosure can be properly performed in a semiconductor device using a III-V group semiconductor crystal containing arsenic (As) as a primary component. Examples of the III-V group semiconductor crystal containing As as a primary component include AlGaAs, InGaAs, AlGaInAs, GaInNAs, and AlGaInNAs. Here, the phrase "including As as a primary component of a V group" means that the ratio of As is 95% or more with respect to all the V group elements of composition elements of the III-V group semiconductor crystal. Similarly, the phrase "including Al or Ga as a primary component of a III group" means that the ratio of Al or Ga is 95% or more with respect to all the III group elements of composition elements of the III-V group semiconductor crystal.

Mechanism for Suppressing Growth of Dislocation Loop

First, a mechanism for forming a dislocation loop will be considered. At this time, when homogeneous nucleation is assumed, an energy for forming a dislocation loop in GaAs is determined by a balance between a self-energy of dislocation (line tension, dislocation core, and a sum of entropy terms) and a chemical potential determined by a stacking fault energy, a degree of supersaturation of point defects, and the temperature of a system. However, it has been clarified that the homogeneous nucleation is not a mechanism for forming a dislocation loop by calculating a formation energy using a known physical quantity.

Therefore, as another mechanism for forming a dislocation loop, formation of a dislocation loop in accordance with formation of a precipitate (cluster) formed of As interstitial atoms will be studied. Actually, formation of an As precipitate in accordance with diffusion of an As interstitial atom has been reported (refer to N. Chen, Y. Wang, H. He, and L. Lin, Japanese Journal of Applied Physics. 1996, volume 35, L 1238-L 1240.). In N. Chen, Y. Wang, H. He, and L. Lin, Japanese Journal of Applied Physics. 1996, volume 35, L 1238-L 1240, GaAs grown by a low temperature molecular beam epitaxy method is subjected to a heat treatment after the growth, and a relation between a distortion amount of a system and structure of a point defect complex is described. That is, an As interstitial atom introduced during crystal growth is grown to a pair of As interstitial atoms, an assembly of four As interstitial atoms, and an assembly of eight As interstitial atoms with increase of a heating temperature. As the assembly of As interstitial atoms is larger, the distortion of the system is smaller. This result indicates that the distortion of the entire system is relaxed by formation of an interstitial As cluster.

Relaxation of the distortion is derived from presence of a nanometer-scale fine dislocation loop around a cluster present in a matrix. Such a small dislocation loop cannot be observed even by using a transmission electron microscope (TEM) or the like. However, when this dislocation loop absorbs supersaturation point defects present therearound and is grown, its presence becomes obvious. When the growth of the dislocation loop further progresses, a semiconductor device may be deteriorated and broken finally. Particularly in a situation where a high load is applied to a semiconductor device, such as a high output laser drive or a high electric field application, an interstitial atom is generated easily in a semiconductor crystal and moves easily, and therefore the growth of the dislocation loop is promoted. Such a dislocation loop is grown in a bulk to cause deterioration of characteristics of the semiconductor device. Therefore, in order to suppress formation of a dislocation loop, it is necessary to suppress movement of an As interstitial atom and prevent formation of a cluster. Hereinafter, introduction of a mechanism for stabilizing a pair of As interstitial atoms into a crystal, which is a pre-stage of a cluster of interstitial As atoms, will be considered. That is, distribution of the interstitial As atoms is dispersed in a bulk, and locally uneven presence of the interstitial As atoms is suppressed.

In GaAs, a relation among elastic constants $C_{11}$, $C_{12}$, and $C_{44}$ is indicated in the following formula (1).

Therefore, GaAs has anisotropy.

$$C_{44} > (C_{11} - C_{12})/2 \quad (1)$$

Therefore, a pair of As interstitial atoms is easily precipitated on a (001) surface, and is stabilized while forming the pair in a <110> direction. The pair of As interstitial atoms in this state is referred to as a <110> dumbbell. FIG. 1 is a schematic diagram illustrating a <110> dumbbell formed between GaAs crystal lattices.

As illustrated in FIG. 1, GaAs has a sphalerite type crystal structure formed of a gallium atom (Ga) and an arsenide atom (As). As illustrated in FIG. 1, the <110> dumbbell is obtained by stabilizing As interstitial atoms while a pair thereof is formed in a <110> direction.

If a mechanism for reducing a formation energy of the <110> dumbbell and increasing a binding energy can be introduced into a crystal, it is possible to suppress diffusion of an As interstitial atom and formation of an As cluster in accordance therewith.

Figure 2:
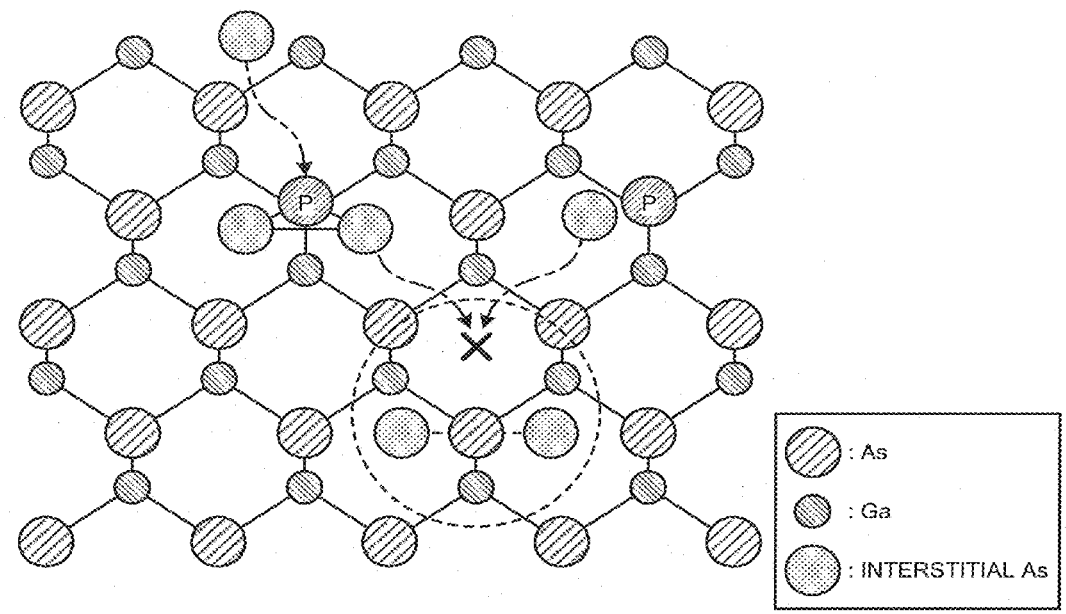
FIG. 2 is a schematic diagram illustrating that stabilizing a <110> dumbbell suppresses clustering of interstitial As atoms.

FIG. 2 is a schematic diagram illustrating that stabilizing a <110> dumbbell suppresses clustering of interstitial As atoms on a (1-10) surface. FIG. 2 corresponds to an example of a case where a phosphorus (P) atom has been introduced into a V group site of a GaAs crystal lattice, which will be verified below. However, a relation between stabilization of a <110> dumbbell and suppression of clustering of interstitial As atoms is not limited to a case where the P atom has been introduced into the V group site.

As illustrated in FIG. 2, an As interstitial atom is present between GaAs crystal lattices. In an example illustrated in FIG. 2, an As interstitial atom forming a <110> dumbbell is present, and an As interstitial atom not forming a <110> dumbbell is present. When these As interstitial atoms move and gather in a region surrounded by the broken line as indicated by the one dot chain line or the two dot chain line, the As interstitial atoms form a cluster.

However, as illustrated in FIG. 2, when the <110> dumbbell is stabilized by a P atom introduced into the V group site, the <110> dumbbell which has been already formed is not decomposed easily, and an As interstitial atom not forming a <110> dumbbell easily forms a new <110> dumbbell. As a result, movement of the As interstitial atom as indicated by the one dot chain line is suppressed. Therefore, formation of a cluster by the As interstitial atoms in the broken line circle in FIG. 2 is also suppressed.

As described above, if formation of a cluster by the As interstitial atoms can be suppressed, generation of a dislocation loop can be suppressed. Therefore, it is understood that stabilization of a <110> dumbbell contributes to suppression of generation of the dislocation loop. Specifically, it is preferable to change a formation energy and a binding energy by introducing a specific impurity having no influence on electric characteristics or optical characteristics of an element. For example, the impurity introduced is preferably a III group element or a V group element from a viewpoint of having no bad influence on electric characteristics.

The degree at which a <110> dumbbell is stabilized according to the kind and the position of an atom introduced including a nitrogen (N) atom, an indium (In) atom, an antimony (Sb) atom, and the like in addition to a P atom will be verified below.

Evaluation of Characteristics by First Principle Electronic State Calculation

Here, a formation energy and a binding energy of a pair of As interstitial atoms (<110> dumbbell) in a GaAs crystal or an AlAs crystal will be verified. As for this verification, a result of a first principle electronic state calculation (simulation) will be described below.

Advance/PHASE manufactured by Advance Soft Corporation was used in the following simulation. Norm-conserving pseudopotential and Vanderbilt type ultrasoft pseudopotential were used for the calculation. An exchange interaction was calculated in a range of generalized gradient approximation. A simulation in consideration of a charged state was performed for evaluation of a formation energy. That is, the number of electrons is adjusted (added in surplus or removed), and the total energy $E_{tot}$ of a system is evaluated while a charge necessary for maintaining electrical neutrality is present in the background.

A formation energy $E_{form}$ per unit cell of a <110> dumbbell depends on a charged state q and a Fermi energy $E_f$ of a system, and is represented by the following formula (2).

$$E_{form}(q,E_f)=E_{tot}[\text{dumbbell}](q)-E_{tot}[\text{bulk}]-\Sigma\mu_n+qE_f \qquad (2)$$

Here, $\mu_n$ represents a chemical potential of an element n. When only a <110> dumbbell is introduced, only an As atom is taken into consideration. A value of $\mu_n$ under a III group (Ga/Al)-rich growth condition is different from a value of $\mu_n$ under a V group (As)-rich growth condition.

When an impurity is introduced, $E_{tot}$ is a total energy $E_{tot}$ of a system including the impurity [dumbbell+ impurity](q), and addition of an impurity atom and removal of a Ga(Al) atom or an As atom is taken into consideration in the term of the chemical potential. Here, the impurity means an element such as P, N, Sb, or In introduced into a GaAs crystal or an AlAs crystal in order to suppress formation of a cluster of As interstitial atoms.

The binding energy of a <110> dumbbell has been defined as a difference between a total energy of a system when the <110> dumbbell is formed and a total energy of a system when two As interstitial atoms apart from each other are present.

Main calculation conditions are as follows.
  atomic model: 64 atoms constituting a matrix (Ga or Al: 32 atoms, As: 32 atoms), As atoms constituting a dumbbell: two, impurity atoms introduced: one to three
  cut-off energy: 30 Ry and 250 Ry in a wave function and a charge density distribution, respectively
  k point sample: 3×3×2
  the number of bands calculated: 200

The simulation was performed using the Earth simulator 2 of the Japan Agency for marine-Earth Science and development organization (JAMSTEC).

Calculation Result 1: Effect of Impurity Introduction

Figure 3:
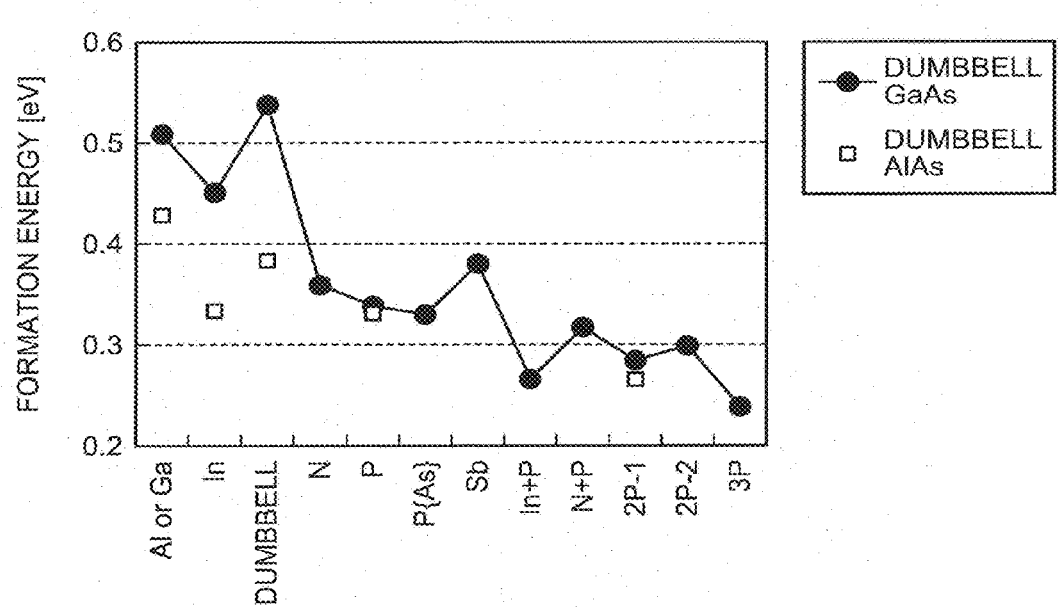
FIG. 3 is a graph illustrating a formation energy of a <110> dumbbell in GaAs or AlAs in a neutral state.

FIG. 3 is a graph illustrating a formation energy of a <110> dumbbell in GaAs or AlAs in a neutral state (III group-rich condition). A similar result is obtained under a V group-rich condition. In the graph illustrated in FIG. 3, the vertical axis indicates a formation energy (eV) of the <110> dumbbell, and the horizontal axis indicates the kind of an element introduced. A result of a case in GaAs is indicated by a black circle. A result of a case in AlAs is indicated by an outlined square.

Figure 4:
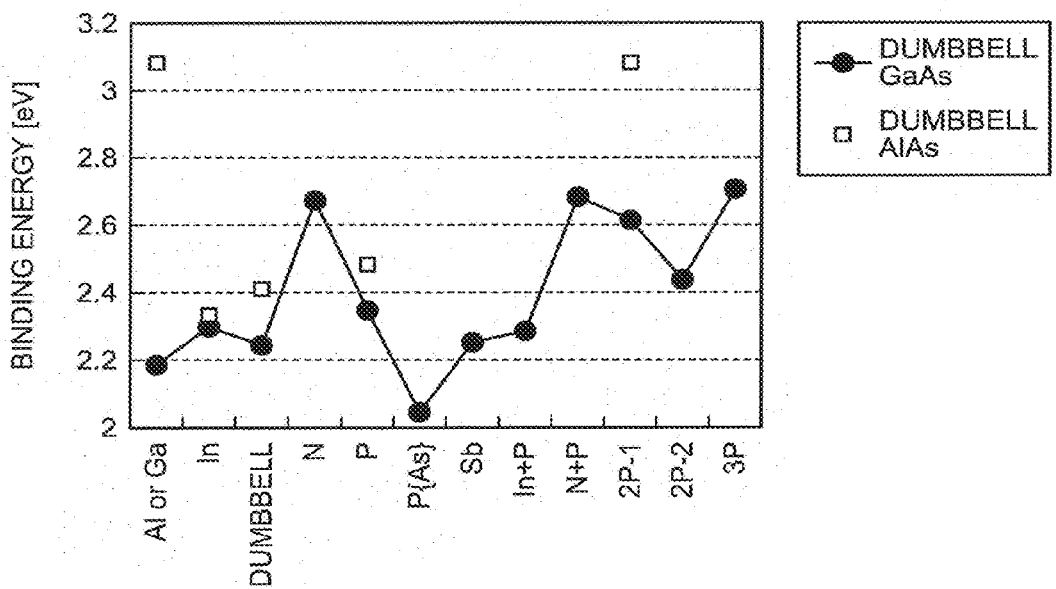
FIG. 4 is a graph illustrating a binding energy of the <110> dumbbell in GaAs or AlAs in the neutral state.

FIG. 4 is a graph illustrating a binding energy of a <110> dumbbell in GaAs or AlAs in a neutral state. In the graph illustrated in FIG. 4, the vertical axis indicates a binding energy (eV) of the <110> dumbbell, and the horizontal axis indicates the kind of an element introduced. A result of a case in GaAs is indicated by a black circle. A result of a case in AlAs is indicated by an outlined square.

Figure 5:
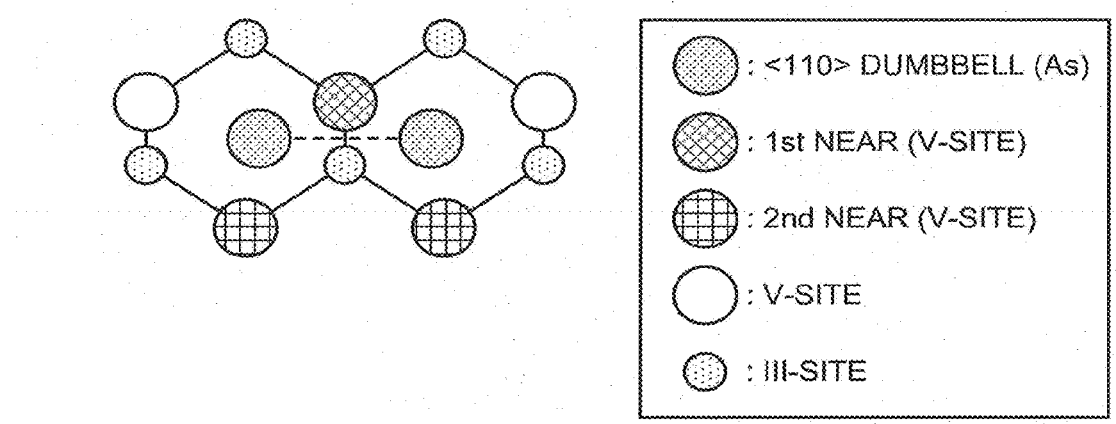
FIG. 5 is a diagram illustrating a III group site, a V group site, a first near position of a dumbbell, and a second near position of the dumbbell.

In the graphs in FIGS. 3 and 4, the ellipsises illustrated in the horizontal axis mean the following. A III group site, a V group site, a first near position of a dumbbell, and a second near position of the dumbbell are illustrated in FIG. 5. The first near position and the second near position are present in the front side and the rear side of the sheet, respectively, due to a steric property of a crystal structure.

Al or Ga: Al is introduced when a matrix is GaAs. Ga is introduced when a matrix is AlAs.
  In: introduced into a III group site
  dumbbell: No impurity is introduced.
  P/N/Sb: introduced into a V group site
  P{As}: As in a dumbbell is replaced with P.
  In+P: P and In are introduced into the first near position of the dumbbell.
  N+P: P and N are introduced into the first near position of the dumbbell.
  2P-1: P is introduced into the first near position of the dumbbell and the second near position thereof.
  2P-2: Two P atoms are introduced into the first near position of the dumbbell.
  3P: Two P atoms are introduced into the first near position of the dumbbell. One P atom is introduced into the second near position.

As illustrated in FIG. 3, by introducing a V group element such as N, P, or Sb, the formation energy of the <110> dumbbell becomes lower than a case where no V group element is introduced. Particularly, an effect in a case where P has been introduced is significant, and the formation energy is reduced by about 0.2 eV. When a III group element has been introduced, the formation energy of the <110> dumbbell is hardly changed or is increased by introduction of Al or Ga.

As illustrated in FIG. 3, the formation energy is reduced by introduction of In although an effect thereof is smaller than that of P. Meanwhile, when In and P are introduced at the same time, the effect of reduction in the formation energy is significant, and a synergistic effect is obtained. When N and P are introduced at the same time, the effect of reduction in the formation energy is larger than that in a case where either N or P is introduced, and a synergistic effect is obtained.

As illustrated in FIG. 3, the effect of reduction in the formation energy of a dumbbell becomes significant by introduction of a plurality of P atoms. The formation energy is reduced by about 0.3 eV. Particularly in the model 3P (two P atoms are introduced into the first near position of the dumbbell, and one P atom is introduced into the second near position), the effect is large.

Meanwhile, as illustrated in FIG. 4, in GaAs, the binding energy is increased by introduction of P or N. When P has been introduced, the binding energy is increased by about 0.1 eV. The effect is increased by introduction of a plurality of P atoms, and the binding energy is increased by about 0.5 eV. In AlAs, the binding energy is increased by introduction of Ga in addition to P.

These results reflect a fact that P or N has high electronegativity (contribution of valence electron), In has a high effective shell charge (contribution of inner shell electron), therefore the surrounding electron density is high, and a stable structure having a less stress tensor is obtained.

As described above, according to FIGS. 3 and 4, by introducing P, N, In, or the like into a crystal structure, an As atom present between lattices easily forms a <110> dumbbell, and the formed <110> dumbbell is not decomposed easily. Specifically, an excessive energy of 0.3 to 0.5 eV is necessary for formation or decomposition of the <110> dumbbell. This indicates that single presence of an interstitial As atom is difficult in a semiconductor crystal. That is, movement of the As interstitial atom is suppressed.

Here, a calculation result for GaAs or AlAs has been indicated, but a similar result is obtained for a mixed crystal thereof.

Figure 6:
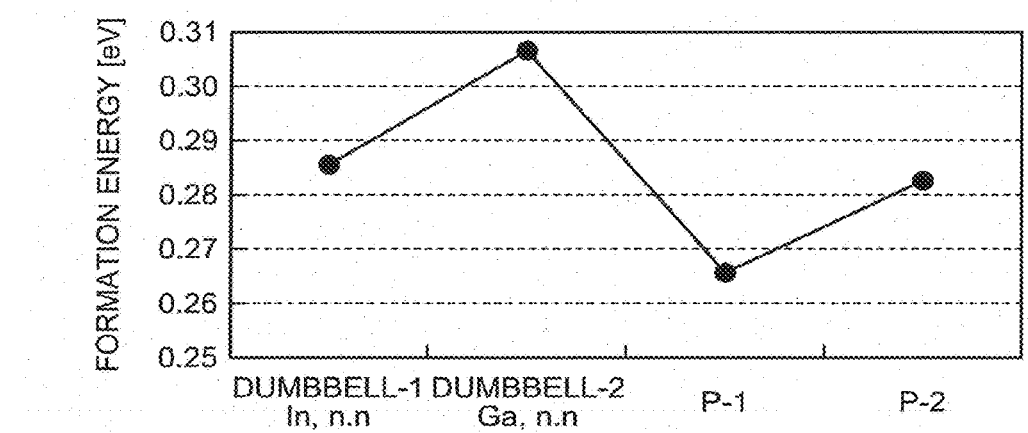
FIG. 6 is a graph illustrating a formation energy of a <110> dumbbell in an $In_{0.6}Ga_{0.4}As$ mixed crystal in a neutral state.

Furthermore, even when a III group element in a matrix is replaced with In, the formation energy of a <110> dumbbell is reduced by introduction of P. FIG. 6 is a graph illustrating a formation energy of a <110> dumbbell in an $In_{0.6}Ga_{0.4}As$ mixed crystal in a neutral state. Calculation is performed under a III group-rich condition. In the III group site in a lattice, an In atom and a Ga atom are assumed to be disposed randomly.

In the graph in FIG. 6, the vertical axis indicates a formation energy (eV) of a <110> dumbbell, and the horizontal axis indicates the kind of an element introduced. The model dumbbell-1 and the model dumbbell-2 illustrated in the horizontal axis indicate cases where an In atom and a Ga atom are arranged in the first near position of the <110> dumbbell, respectively. The model P-1 and the model P-2 are obtained by introducing P into the model dumbbell-1 and the model dumbbell-2, respectively.

As illustrated in FIG. 6, the formation energy of the <110> dumbbell is reduced by about 20 to 30 meV by introduction of P. In an actual InGaAs mixed crystal, a possibility that the model dumbbell-1 and the model P-1 having a lower formation energy are formed is increased (a dumbbell is formed near an In atom). This is because the effective shell charge of the In atom is high.

An amount of reduction in the formation energy by introduction of P is smaller than that of GaAs or AlAs because an effect of the effective shell charge of the In atom constituting a matrix blocks an effect of electronegativity of a P atom. When another V group element has been introduced like P, a similar effect is obtained. Even in the InGaAs mixed crystal, the binding energy of a <110> dumbbell is increased by introduction of a V group element.

In the InGaAs mixed crystal, as described above, contribution of the effective shell charge of the In atom constituting a matrix is reflected more largely than that of GaAs or AlAs, and therefore the formation energy of a <110> dumbbell is reduced by about 0.1 to 0.25 eV with respect to GaAs or AlAs. This means that the concentration of the single As interstitial atom becomes high more easily to form an As cluster more easily and an effect of introducing the above impurity is higher in an AlGaAs mixed crystal than in the InGaAs mixed crystal.

As described above, as illustrated in FIGS. 3 and 4, even when a combination of P and In or a combination of P and N has been introduced into GaAs, AlAs, or a mixed crystal of GaAs and AlAs, effects of reducing the formation energy of a <110> dumbbell and increasing the binding energy are obtained. As illustrated in FIG. 6, when a V group element has been introduced into the InGaAs mixed crystal, an effect of reducing the formation energy of a <110> dumbbell is obtained. Therefore, the above calculation result can be generalized also to a III-V group semiconductor crystal containing As as a primary component, such as GaAs, AlAs, AlGaAs, InGaAs, AlGaInAs, or GaInNAs.

Calculation Result 2: Effect of Matrix Conductivity

As indicated by formula (2) above, the formation energy of a <110> dumbbell depends on a Fermi energy of a system. Therefore, an influence of a matrix conductivity on the formation energy of a <110> dumbbell will be studied below.

Figure 7:
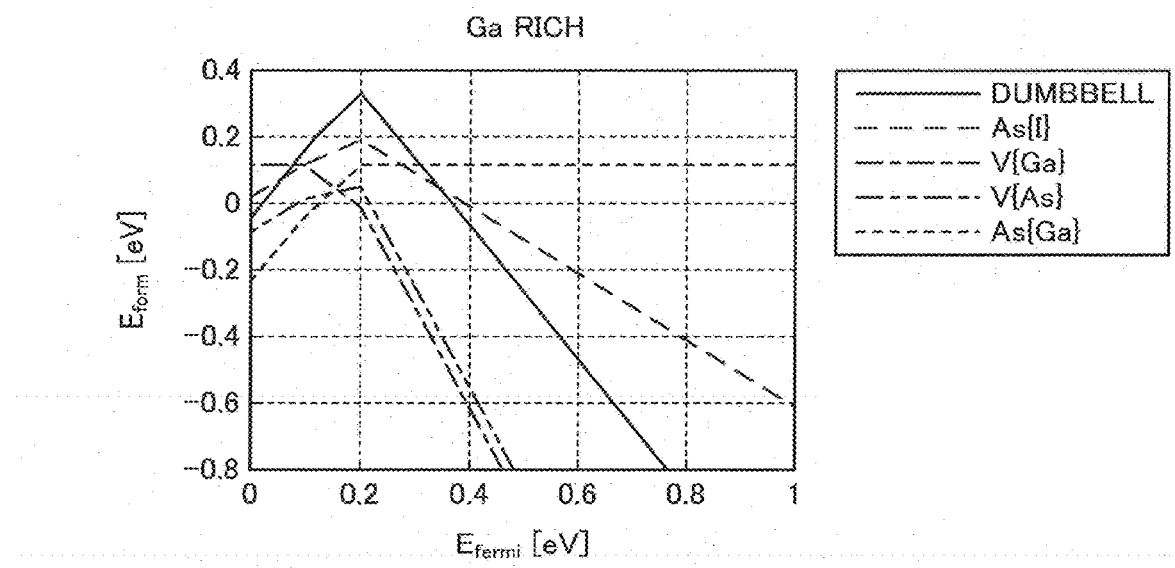
FIG. 7 is a graph illustrating a formation energy of a <110> dumbbell in GaAs.

FIG. 7 is a graph illustrating a formation energy of a <110> dumbbell in GaAs (Ga-rich condition). In the graph illustrated in FIG. 7, the inclination indicates a charged state. A positive inclination indicates a donor, and a negative inclination indicates an acceptor.

For comparison, FIG. 7 also illustrates graphs of an As interstitial atom (As{I}), a Ga hole (V{Ga}), an As hole (V{As}), and an As antisite defect (As{Ga}) which are other lattice defects.

As illustrated in FIG. 7, when a Fermi energy is high and close to a conduction band (n-type conductivity), the formation energy of a <110> dumbbell is lower than that of an As interstitial atom. Meanwhile, when the Fermi energy is low and close to a valence band (p-type conductivity), the formation energy of a <110> dumbbell is almost the same as that of an As interstitial atom.

This result indicates that a <110> dumbbell is more stable than a single As interstitial atom in GaAs having re-type conductivity. That is, this result indicates that the single As interstitial atom moving in a lattice forms the <110> dumbbell easily and suppresses diffusion of the As interstitial atom more significantly in GaAs having n-type conductivity.

Specifically, the graph of the formation energy of the <110> dumbbell intersects the graph of the formation energy of the As interstitial atom at a Fermi energy of about 0.35 eV. Therefore, when the Fermi energy is higher than 0.35 eV, the formation energy of the <110> dumbbell is lower than that of the As interstitial atom.

A bandgap of GaAs obtained by simulation is about 1 eV. A Fermi energy in an intrinsic semiconductor is about 0.5 eV. The fact that the formation energy of the As interstitial atom intersects the formation energy of the <110> dumbbell at 0.35 eV indicates that the <110> dumbbell is stable as long as no p-type impurity is added intentionally. However, as illustrated in FIG. 7, the formation energy of the Ga hole or the As hole serving as an acceptor when the Fermi energy is about 0.5 eV is low. In addition, presence of a residual impurity such as carbon reduces the Fermi energy. Therefore, intentional addition of an n-type dopant can make the formation energy of the <110> dumbbell lower than the formation energy of the As interstitial atom more securely. The concentration of the n-type dopant is only required to be able to cancel a compensation effect by a hole or a residual impurity. For example, the concentration of the n-type dopant is preferably $1\times10^{15}$ $cm^{-3}$ or more. For example, even when such a mixed crystal having n-type conductivity is formed as an n-type conductivity region in a region which should act as a p-type semiconductor in a semiconductor device, the mixed crystal exhibits such an effect that formation of the <110> dumbbell by the As interstitial atom in the n-type conductivity region is more stable. Examples of the n-type dopant include silicon (Si) and selenium (Se).

Figure 8:
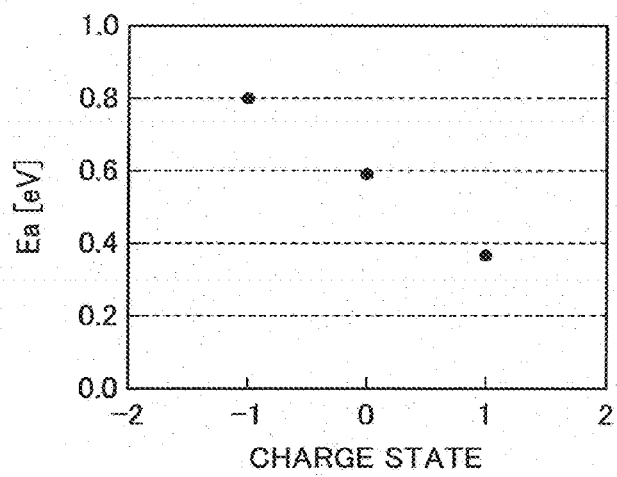
FIG. 8 is a graph illustrating a magnitude of a diffusion barrier of an interstitial As atom.

FIG. 8 is a graph illustrating a magnitude of a diffusion barrier of interstitial As atoms. As illustrated in FIG. 8, a barrier Ea with respect to diffusion of a single As interstitial atom depends on a charged state. When the charged state is −1 (in GaAs having n-type conductivity), the barrier Ea is about 0.8 eV. When the charged state is +1 (in GaAs having p-type conductivity), the barrier Ea is about 0.4 eV. That is, the barrier with respect to diffusion of a single As interstitial atom in GaAs having n-type conductivity is two times or more as large as that in GaAs having p-type conductivity.

By combination of the results of FIGS. 7 and 8, the following can be concluded. That is, an As atom present between lattices is easily present singly and has a low diffusion barrier in GaAs having p-type conductivity, but an As atom present between lattices easily forms a <110> dumbbell and has a high diffusion barrier in GaAs having n-type conductivity. As a result, diffusion of an As atom is suppressed largely in GaAs having n-type conductivity.

As for the above influence of the matrix conductivity, an example of GaAs into which no impurity has been introduced has been described. However, GaAs into which an impurity has been introduced has a similar effect. For example, when P has been introduced into GaAs, the diffusion barrier of an As interstitial atom is increased about by 10% (increased by 50 meV in a neutral state). That is, by introducing P into GaAs to make the matrix conductivity an n-type, an effect of suppressing diffusion of an As interstitial atom becomes more significant.

Here, a calculation result for GaAs has been indicated, but a similar result is obtained for AlAs, InAs, or a mixed crystal thereof.

Summary of Simulation

The above (Calculation result 1) and (Calculation result 2) suggest that the following countermeasures are effective in order to suppress diffusion of an As interstitial atom in a III-V group semiconductor crystal containing As as a primary component, such as GaAs, AlAs, AlGaAs, InGaAs, AlGaInAs, or GaInNAs.

(1) A <110> dumbbell is stabilized by introducing an element such as P, N, Sb, or In into a crystal structure.

(2) The <110> dumbbell is made more stable than a single As interstitial atom by making the matrix conductivity an n-type.

Verification Experiment

Here, as verification of the above simulation result, a verification experiment of an effect obtained when P has been introduced into a crystal structure of a III-V group semiconductor crystal containing As as a primary component will be described.

Table 1 shown below summarizes results of an experiment to verify a relation among a concentration of P replaced in a V group element site, formation of a dumbbell, and detection of an As precipitate. A verification experiment shown in Table 1 is performed as follows.

Secondary ion mass spectrometry (SIMS) is used for measurement of a concentration of P. SIMS is a surface measurement method for irradiating a surface of a solid with a beam-shaped ion (called a primary ion) and detecting an ion (called a secondary ion) generated by collision between the ion and the surface of the solid at a molecular or atomic level with a mass spectrometer. SIMS has a spatial resolution of about 10 µm, but can quantify P having a concentration of about 0.01%. For example, SIMS is suitably used for a GaAs long cavity laser element. Examples of a measurement device employing this SIMS include a sector type SIMS (IMS series) manufactured by Cameca SAS.

An atom probe method is used for measurement of a concentration of P. In the atom probe method, first, as preparation for a sample, a region including a measurement object is processed into a needle shape (probe shape) using a focused ion beam (FIB) processing device. Thereafter, by applying a voltage pulse in an ultra-high vacuum environment, a constituent atom is subjected to electric field evaporation from a tip of the sample processed into a probe shape, flight time of the atom subjected to electric field evaporation is measured, and an atomic mass is thereby analyzed. When the atom probe method is used for a semiconductor, it is preferable to assist evaporation of an atom with laser light in order to prevent charge-up.

For example, this measurement method is suitable for measuring a P concentration in an active layer in an InP type BH laser element. This is because an analysis range can be narrower (for example, 1 µm or less) than a usual SIMS. Examples of a measurement device employing this atom probe method include LEAP series manufactured by Cameca SAS.

A concentration of P is measured using a scanning tunneling microscope (STM). A measurement method using STM is suitable for any InP type BH laser element or any GaAs type ridge laser element. The measurement method using STM is performed by cleaving a sample in an ultra-high vacuum environment to expose a cross section of an active layer, and observing an atomic image with STM.

STM is a microscope to obtain a topographic image of an atom by applying a bias voltage of several V between a probe having a tip curvature of a nanometer order and a sample surface, and feeding back a small flowing tunnel current (about 1 nA or less). At this time, an electron state is different between Ga, As, or the like as a matrix and P, and therefore a difference is generated in a contrast of an image obtained by STM. Therefore, the concentration can be evaluated by counting the number of atoms of P from the image obtained by STM. Examples of STM which can be used in this measurement method include STM-1 and LT-STM manufactured by Omicron, Inc.

Furthermore, the concentration of P can be determined by measurement of an optical bandgap by photoluminescence measurement or measurement of a lattice constant by X-ray diffraction.

For example, formation of a <110> dumbbell can be confirmed by Raman spectrometry. This is because a Raman-active vibrational mode is generated due to a <110> dumbbell in a crystal in which the <110> dumbbell is formed. For example, by measuring a localized vibration mode at 50 to 150 cm$^{-1}$ with respect to an LO mode of a mixed crystal constituting an active layer using an Ar ion laser having a wavelength of 488 nm or a third high harmonic of a YAG laser having a wavelength of 355 nm, formation of the <110> dumbbell can be confirmed. Here, the polarization arrangement in the Raman scattering measurement is Z (x, x+y)-z (Z=[001], x=[100], y=[010]). When a localized vibration mode having an intensity ratio of 1/1000 or more with respect to the LO mode is measured, it is determined that a <110> dumbbell is formed.

When the concentration of P in Table 1 is 5% or more, a localized vibration mode due to the <110> dumbbell overlaps a vibration mode due to P replaced in the group V site, and therefore formation of the <110> dumbbell cannot be confirmed. Accordingly, Table 1 describes that this case is unevaluable.

In addition, there is anisotropy measurement of a distortion by X-ray diffraction as a method for directly observing formation of a <110> dumbbell. In this method, measurement with high accuracy can be performed by using wavelength-tunable radiation. A dependency of a lattice constant on a depth direction is measured by measuring a plurality of diffractive surfaces after removing a waveguide structure on an active layer by etching.

Specifically, when a (006) surface perpendicular to a crystal surface and a (044) surface and a (113) surface inclined with respect to the crystal surface are selected as the diffraction surfaces, an interplanar distortion and an in-plane distortion are present in a P-doped sample in which a <110> dumbbell is present (0.1% distortion per 1% of P concentration). However, an interplanar distortion is present but no in-plane distortion is present in a reference sample not forming a <110> dumbbell. Formation of a <110> dumbbell can be detected by this difference.

Figure 9:
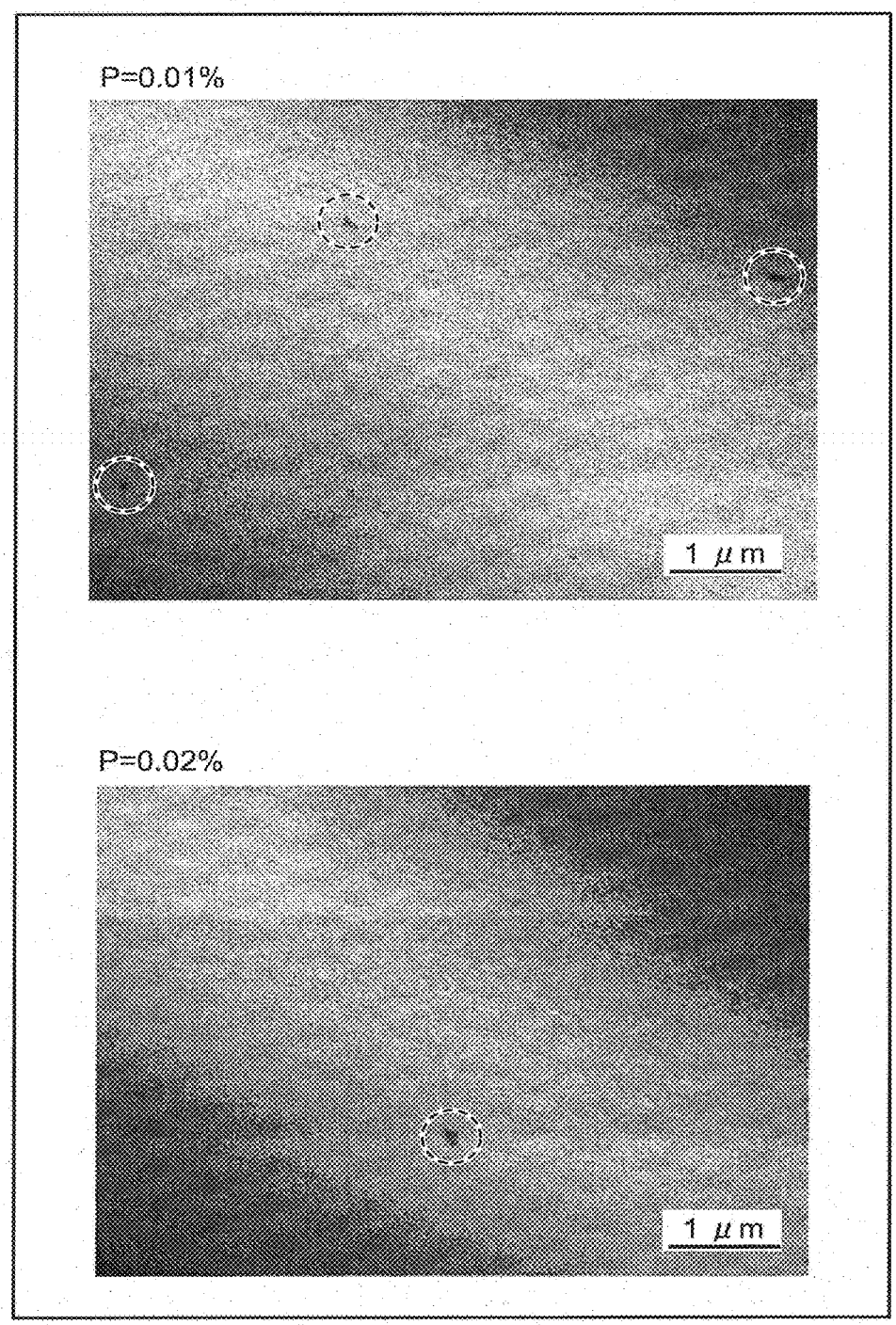
FIG. 9 is a diagram illustrating an observation image with TEM.

An As precipitate is observed with a transmission electron microscope (TEM). Quantification regarding the As precipitate uses the observation number based on a cavity length of 100 µm in a resonator having a width of 25 µm. For example, as illustrated in FIG. 9, when observation is performed with TEM, presence of the As precipitate is observed like a portion in the broken line circle. By aggregating the As precipitate thus detected per 100 µm of the cavity length, quantification regarding the As precipitate is performed. The observation image with TEM illustrated in FIG. 9, is obtained by cutting out a part of a measurement range in each of a case where the concentration of P is 0.01% or less (this means that no P is added substantially, hereinafter the same) and a case where the concentration of P is 0.02%.

TABLE 1

| | Concentration of P [%] | | | | | | | |
|---|---|---|---|---|---|---|---|---|
| | 0.01 | 0.02 | 0.1 | 0.5 | 1 | 3 | 5 | 10 |
| Dispersibility of As | poor | fair | good | good | good | good | good | good |
| Formation of dumbbell | Not detected | Not detected | Detected | Detected | Detected | Detected | Unevaluable | Unevaluable |
| As precipitate | Seven/100 µm | One/100 µm | Not detected | Not detected | Not detected | Not detected | Not detected | Not detected |

According to the verification experiment described above, in Raman spectrometry, a localized vibration mode due to a <110> dumbbell is not observed in the cases where the concentrations of P in a crystal are 0.01% and 0.02%. On the other hand, a localized vibration mode due to a <110> dumbbell is observed in a range in which the concentration of P in a crystal is 0.1% or more and less than 5%. Therefore, when the concentration of P in a crystal is 0.1% or more, it is considered that stabilization of an interstitial As atom due to a <110> dumbbell functions well.

When the concentration of P in a crystal was 0.01% in the TEM observation, seven As precipitates were observed per 100 wof the cavity length. On the other hand, when the concentration of P in a crystal was 0.02%, one As precipitate was observed per 100 µm of the cavity length. When the concentration of P in a crystal was 0.1% or more, no As precipitate was observed. Therefore, when the case where the concentrations of P in a crystal are 0.01% and 0.02% are compared with each other, there is a significant difference in the amount of the As precipitate therebetween. That is, when the concentration of P in a crystal is 0.02% or more, the amount of the As precipitate is suppressed to be small sufficiently so as not to have an influence on performance.

The above verification experiment has indicated only P as an impurity to be replaced in a V group element site. However, even an impurity to be replaced in a V group element site such as N or Sb performs a similar action by the same principle.

Therefore, the concentration of P, N, or Sb replaced in a V group element site is preferably 0.02% or more, and more preferably 0.1% or more with respect to the total amount of V group elements in the V group element site.

Even when In is introduced into a III-V group semiconductor crystal containing Al or Ga as a primary component, the concentration of In replaced in a III group element site is preferably 0.1% or more with respect to the total amount of III group elements in the III group element site. This is because a possibility that an impurity atom which has been introduced is close to another P impurity atom is increased and the state of the model 2P-1 illustrated in the horizontal axis in FIGS. 3 and 4 (P atoms are arranged in the first near position and the second near position of a <110> dumbbell)

is realized easily within this range. As a result, as read from the graphs in FIGS. 3 and 4, when the concentration of an impurity atom in a V group element site is from 0.1 to 5%, the formation energy of a <110> dumbbell is low and the binding energy is high.

As the concentration of an impurity atom is higher, a possibility that the state of the model 3P (two P atoms are arranged in the first near position of a <110> dumbbell and one P atom is arranged in the second near position) is realized is higher. The higher concentration of an impurity atom is preferable from a viewpoint of the formation energy and the binding energy.

The concentration of an impurity atom added to a III-V group semiconductor crystal containing As as a primary component is preferably 5% or less. This is because the concentration of an impurity atom of 5% or less makes initial characteristics excellent. Here, the initial characteristics are evaluated using a maximum slope efficiency when the temperature is changed. The slope efficiency is defined by an inclination of current-optical power characteristics, and the unit thereof is [mW/mA].

Table 2 shown below summarizes verification results of the initial characteristics. Table 2 indicates that the concentration of an impurity atom of 5% or less makes initial characteristics excellent. Particularly when the concentration of an impurity atom is 3% or less, deterioration of the initial characteristics is not measured.

TABLE 2

| | Concentration of P (%) | | | | | | | |
|---|---|---|---|---|---|---|---|---|
| | 0.01 | 0.02 | 0.1 | 0.5 | 1 | 3 | 5 | 10 |
| Initial characteristics (efficiency) | good | good | good | good | good | good | fair | poor |

Electrification and measurement of current-optical power characteristics are further repeated to measure an increase ratio of a threshold. When the increase ratio of a threshold was measured under an acceleration condition of 120° C./150 mA, gradual deterioration was suppressed when the concentration of P was 0.02%, 3%, or 5%. When the increase ratio of a threshold was measured under an acceleration condition of 155° C./125 mA, gradual deterioration was suppressed when the concentration of P was 0.02% or 3%. Therefore, the concentration of an impurity atom of 5% or less is preferable because gradual deterioration is suppressed, and the concentration of an impurity atom of 3% or less is more preferable.

When the concentration of an impurity atom is 5% or less, a difference in lattice constant or bandgap between a substrate of the mixed crystal and the impurity atom is not large. Therefore, deterioration of initial characteristics of an element is suppressed by reduction in mobility due to formation of a misfit dislocation or alloy scattering, reduction in electron concentration due to a potential sensed by a two-dimensional electron gas different from a designed value in a case of an element using the two-dimensional electron gas, or the like. When In which is a III group element is used as an impurity atom, the concentration thereof is preferably 1% or less. This is because a concentration of more than 1% prevents formation of a <110> dumbbell due to clustering of In.

When the above verification experiments are summarized, the concentration of P, N, or Sb replaced in a V group element site is preferably 0.02% or more and 5% or less, and more preferably 0.1% or more and 3% or less with respect to the total amount of V group elements in the V group element site.

Hereinafter, embodiments of a semiconductor device subjected to the above countermeasures will be described.

First Embodiment

Figure 10:
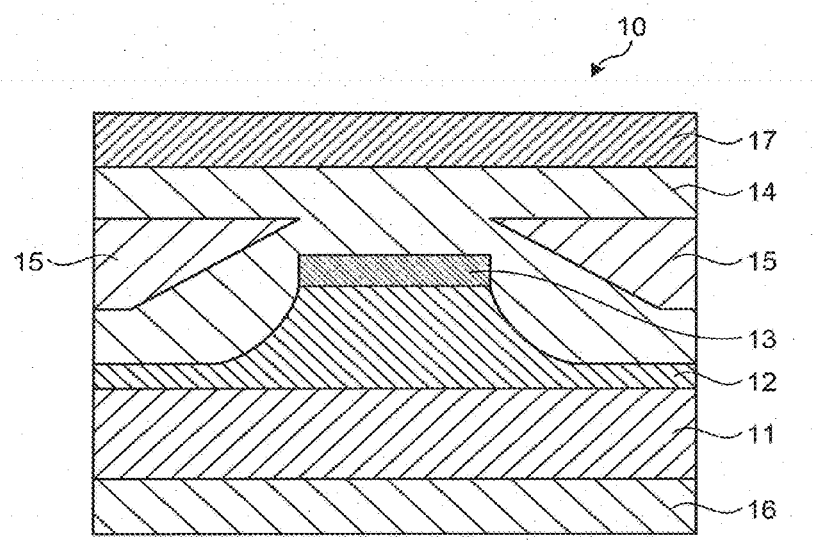
FIG. 10 is a schematic diagram illustrating a semiconductor device according to a first embodiment.

FIG. 10 is a schematic diagram illustrating a semiconductor device according to a first embodiment. The semiconductor device illustrated in FIG. 10 is a semiconductor laser element using a buried heterostructure (BH) for a current confining structure. FIG. 10 is a cross sectional view parallel to an emitting surface of this semiconductor laser element.

As illustrated in FIG. 10, in a semiconductor laser element 10 according to the first embodiment, an n-type semiconductor layer 12 and an active layer 13 are stacked sequentially on a substrate 11. An upper portion of the n-type semiconductor layer 12 and the active layer 13 form a mesa structure having a longitudinal direction in an emitting direction. The active layer 13 has a multi quantum well (MQW) structure including a well layer and a barrier layer.

A p-type semiconductor layer 14 is stacked on the mesa structure including the upper portion of the n-type semiconductor layer 12 and the active layer 13. An n-type semiconductor layer 15 as a current confining structure is formed so as to be adjacent to both sides of the mesa structure in a width direction in the p-type semiconductor layer 14. An n-side electrode 16 is formed on a back surface of the substrate 11. A p-side electrode 17 is formed on a front surface of the p-type semiconductor layer 14.

The n-type semiconductor layer 15 as a current confining structure confines a current injected from the A-side electrode 17 therein, confines light generated by the active layer 13 in a lateral (width) direction, and realizes a single lateral mode operation suppressing a high-order horizontal lateral mode.

The well layer of the active layer 13 is formed of InGaAsP obtained by introducing P into InGaAs. Meanwhile, the barrier layer of the active layer 13 is formed of AlGaAs, and performs a function of a barrier for confining a carrier in the well layer. The active layer 13 is not limited to the above examples, but may be formed of a III-V group semiconductor containing As as a primary component, such as GaAs, AlAs, AlGaAs, InGaAs, AlGaInAs, or GaInNAs.

In the present embodiment, P is introduced only into the well layer of the active layer 13, but P may be introduced also into AlGaAs of the barrier layer to introduce P into the entire active layer 13. The structure of the active layer 13 is not limited to the multi quantum well structure. Any structure of the active layer 13 suppresses generation of a dislocation loop by introduction of P. An impurity introduced is not limited to P, but N, Sb, or In may be introduced.

The active layer 13 becomes an active state when the semiconductor laser element 10 is driven, and therefore an As interstitial atom is not formed easily and the As interstitial atom moves easily therein. Therefore, introduction of P, N, Sb, or In into the active layer 13 has a large effect. Particularly when the active layer 13 has a multi quantum well structure, the well layer becomes an active state when the semiconductor laser element 10 is driven. Therefore, selective introduction of P, N, Sb, or In only into the well layer has also a large effect.

In addition, the active layer 13 preferably has n-type conductivity. Therefore, an n-type dopant is preferably added to the active layer 13. Examples of the n-type dopant include selenium (Se), sulfur (S), and silicon (Si). The concentration of the n-type dopant in the active layer 13 is preferably lower than that in another n-type semiconductor layer. For example, the concentration of the n-type dopant in the active layer 13 is preferably $1\times10^{18}$ cm$^{-3}$ or less. This is because a concentration of more than $1\times10^{18}$ cm$^{-3}$ makes the concentration of a Ga hole or an As hole in a semiconductor high, and therefore the binding energy of an adjacent <110> dumbbell is reduced to lower an effect of suppressing diffusion of an As interstitial atom. The concentration of the n-type dopant in the active layer 13 is preferably a sufficient amount for cancelling a compensation effect by a hole or a residual impurity, for example, $1\times10^{15}$ cm$^{-3}$ or more.

Another semiconductor layer is formed of a semiconductor having a higher bandgap energy and a lower refractive index than the well layer in the active layer 13. The other semiconductor layer is preferably formed of a III-V group semiconductor containing As as a primary component, but may be formed of InP, for example.

P, N, Sb, or In can be introduced into all the semiconductor layers in the semiconductor laser element 10. However, P, N, Sb, or In may be introduced selectively into a portion where a dislocation loop is easily generated in addition to the active layer 13. For example, it is effective for suppressing generation of a dislocation loop to introduce P, N, Sb, or In selectively into a portion under the p-side electrode 17 in the p-type semiconductor layer 14, a portion near an interface between an epitaxial substrate and the n-type semiconductor layer 12 in the n-type semiconductor layer 12, or the like. In addition, it is effective for suppressing generation of a dislocation loop to selectively make a portion where a dislocation loop is easily generated n-type conductive. As described above, even with slightly larger n-type conductivity than an intrinsic semiconductor, generation of a dislocation loop is suppressed. Therefore, even a p-type semiconductor layer in the semiconductor laser element 10 can suppress generation of a dislocation loop by forming a region having such weak n-type conductivity to have no influence on a function of the semiconductor laser element 10.

Example 1

Example 1 has a structure obtained by embodying the first embodiment. Therefore, in the description of Example 1, FIG. 10 will be referred to like in the first embodiment. Description of a portion overlapping the description of the first embodiment will be omitted.

The semiconductor laser element 10 according to Example 1 is a so-called AlInGaAsP—BH laser element on an InP substrate. Therefore, the n-type semiconductor layer 12 formed, for example, of n-type InP, the active layer 13, and the p-type semiconductor layer 14 formed, for example, of p-type InP are stacked on the substrate 11 formed of InP.

An upper portion of the n-type semiconductor layer 12 and the active layer 13 form a mesa structure.

The active layer 13 has a MQW structure obtained by stacking six pairs of a well layer and a barrier layer repeatedly. For example, when the semiconductor laser element 10 is formed at a resonator width (stripe width of the active layer 13) of 2 μm and a cavity length (stripe length of the active layer 13) of 0.3 mm, optical power of more than 500 mW can be obtained at one chip.

The thicknesses of the well layer and the barrier layer are 6 nm and 10 nm, respectively. Distortions of the well layer and the barrier layer with respect to the InP substrate are 1% and −0.3%, respectively. When the layer has a larger distortion than a lattice constant of the substrate, the distortion is referred to as a positive distortion. When the layer has a smaller distortion than a lattice constant of the substrate, the distortion is referred to as a negative distortion.

The composition of each of the active layer and the barrier layer in the active layer 13 is adjusted according to the concentration of P added such that the oscillation wavelength is 1.55 μm. Here, the compositions of the active layer 13 having different concentrations of P will be exemplified. In an example of an active layer having no P added, the well layer is $Al_{0.058}In_{0.676}Ga_{0.267}As$, and the barrier layer is $Al_{0.206}In_{0.488}Ga_{0.306}As$. In an example of an active layer having P added at a concentration of 1%, the well layer is $Al_{0.054}In_{0.68}Ga_{0.265}As_{0.99}P_{0.01}$ and the barrier layer is $Al_{0.203}In_{0.49}Ga_{0.307}As_{0.99}P_{0.01}$. In an example of an active layer having P added at a concentration of 3%, the structure of the active layer 13 has a well layer of $Al_{0.048}In_{0.69}Ga_{0.262}As_{0.97}P_{0.03}$ and a barrier layer of $Al_{0.2}In_{0.6}Ga_{0.2}As_{0.97}P_{0.03}$. In this way, even when an active layer having P added at another concentration is formed, the composition of a III group (Al, Ga, and In) can be adjusted such that the oscillation wavelength and the distortion are the same as those of the above examples.

Figure 11:
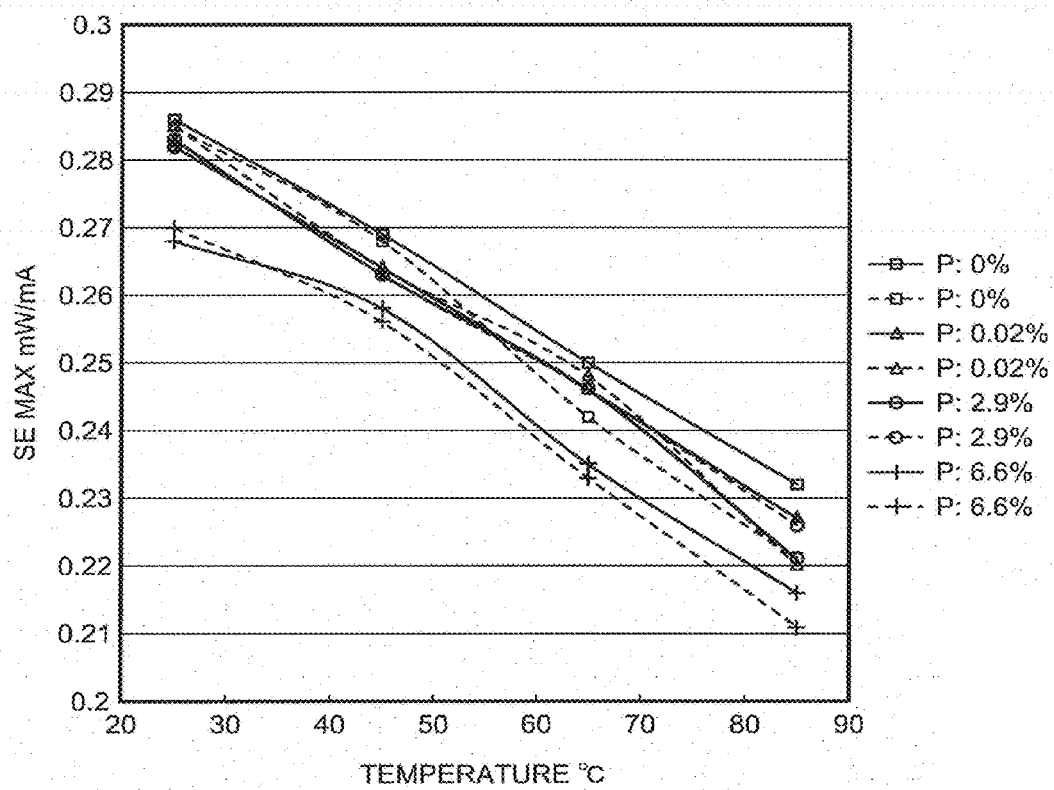
FIG. 11 is a graph illustrating a slope efficiency of a semiconductor laser element when the concentration of P in an active layer is changed.

Here, when the concentration of P in the active layer is changed, initial characteristics of a semiconductor laser element and gradual deterioration thereof will be compared and studied. FIG. 11 is a graph illustrating a slope efficiency of a semiconductor laser element when the concentration of P in an active layer is changed. FIG. 11 illustrates data of two semiconductor laser elements having the same structure and composition with a solid line and a broken line.

As illustrated in FIG. 11, a maximum slope efficiency is not changed when the concentration of P in the active layer is 3% or less. For example, the maximum slope efficiency at 25° C. is from 0.28 to 0.29 mW/mA. Meanwhile, when the concentration of P in the active layer is more than 5%, the slope efficiency is reduced. For example, when the concentration of P in the active layer is 6.6%, the maximum slope efficiency at 25° C. is from 0.22 to 0.23 mW/mA. When the concentration of P in the active layer is more than 10%, the slope efficiency at 25° C. is reduced significantly to be 0.2 mW/mA. Therefore, the semiconductor laser element 10 according to Example 1 has excellent initial characteristics.

Furthermore, variation of lasing characteristics due to long-term electrification will be examined. That is, electrification and measurement of current-optical power characteristics are repeated to measure an increase ratio of a threshold. Here, variation of lasing characteristics due to electrification under two conditions of 120° C.-150 mA and 155° C.-125 mA will be examined.

Under the acceleration condition of 120° C.-150 mA, a semiconductor laser element of the active layer having no P added increases the threshold gradually after more than 1000 hours have passed, and some elements increase the threshold by 10% or more after more than 2000 hours have passed. Some elements increase the threshold rapidly and are broken.

Meanwhile, when the concentration of P in the active layer is 0.02%, 2.9%, or 6.6%, gradual deterioration of the semiconductor laser element is suppressed. The increase ratio of the threshold is 8% or less when 2000 hours have passed.

Also under the electrification condition of 155° C.-125 mA, the tendency of increase in the threshold is not changed. When the concentration is 0.02% or 2.9%, increase in the threshold is suppressed. On the other hand, in an example in which no P is added, increase in the threshold by 10% to 20% is measured after electrification for 1000 hours.

In general, addition of Al to a composition of an active layer tends to increase gradual deterioration of a semiconductor laser element. However, addition of P at a concentration of 0.02% or more and 5% or less to an active layer suppresses gradual deterioration of a semiconductor laser element. Addition of P at a concentration of 0.1% or more and 3% or less further suppresses gradual deterioration. This means that addition of Al to a composition of an active layer increases a parameter to adjust an oscillation wavelength of a semiconductor laser element and a distortion thereof. Therefore, the degree of freedom in designing a semiconductor laser element is improved.

When an internal state of a semiconductor laser element used for electrification was observed using TEM, seven As precipitates were observed per 100 μm of a cavity length in a direction along a resonator in an example in which no P was added. On the other hand, one As precipitate was observed per 100 μm of the cavity length when the concentration of P was 0.02%. In a semiconductor laser element having a concentration of P of 0.1% or more, no As precipitate was observed. This result means that addition of P to an active layer improved dispersibility of an As interstitial atom in the active layer.

Second Embodiment

Figure 12:
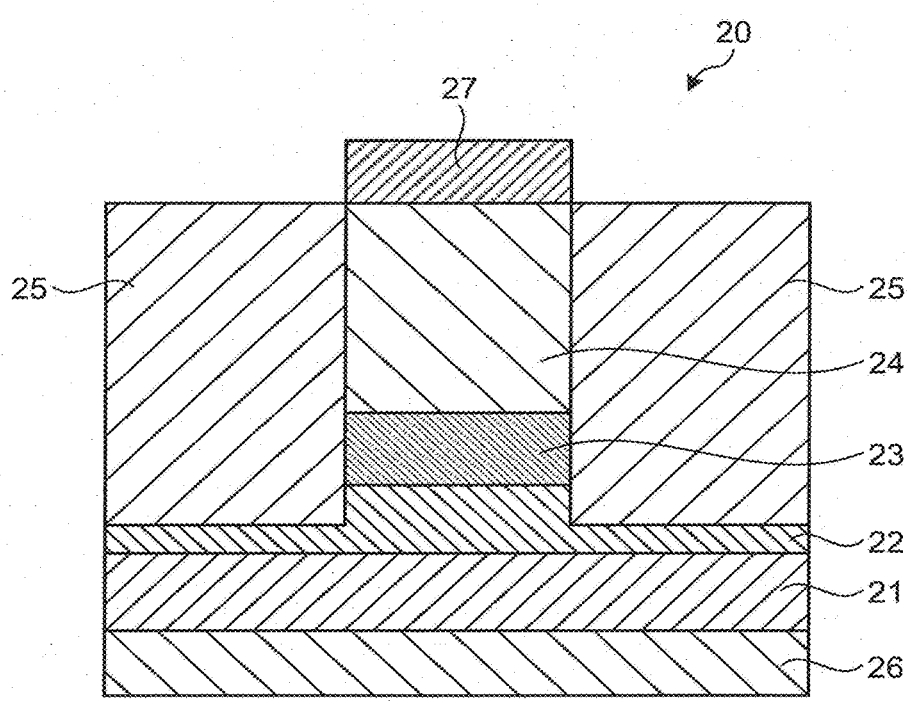
FIG. 12 is a schematic diagram illustrating a semiconductor device according to a second embodiment.

FIG. 12 is a schematic diagram illustrating a semiconductor device according to a second embodiment. The semiconductor device illustrated in FIG. 12 is a semiconductor laser element using a semi-insulating buried heterostructure (SI-BH). FIG. 12 is a cross sectional view parallel to an emitting surface of this semiconductor laser element.

As illustrated in FIG. 12, in a semiconductor laser element 20 according to the second embodiment, an n-type semiconductor layer 22, an active layer 23, and a p-type semiconductor layer 24 are stacked sequentially on a substrate 21. An upper portion of the n-type semiconductor layer 22, the active layer 23, and the p-type semiconductor layer 24 form a mesa structure having a longitudinal direction in an emitting direction. The active layer 23 has a multi quantum well structure including a well layer and a barrier layer.

A buried layer 25 formed of a high resistance material such as Fe—InP is formed on both sides of the mesa structure including the upper portion of the n-type semiconductor layer 22, the active layer 23, and the p-type semiconductor layer 24. An n-side electrode 26 is formed on a back surface of the substrate 21. A p-side electrode 27 is formed on a front surface of the p-type semiconductor layer 24. The buried layer 25 suppresses spread of a current flowing from the p-side electrode 27 to the n-side electrode 26, and confines light generated by the active layer 23 in a lateral (width) direction. For example, the buried layer 25 is formed of a semi-insulating III-V group semiconductor doped with iron (Fe). The buried layer 25 is not limited to the semi-insulating III-V group semiconductor doped with iron (Fe), but may be a semi-insulating III-V group semiconductor doped with ruthenium (Ru).

The well layer of the active layer 23 is formed of $InGaAs_{0.99}P_{0.01}$ obtained by introducing P into InGaAs. Meanwhile, the barrier layer of the active layer 23 is formed of AlGaAs, and performs a function of a barrier for confining a carrier in the well layer. The active layer 23 is not limited to the above examples, but may be formed of another III-V group semiconductor containing As as a primary component. As in the first embodiment, in the present embodiment, the structure of the active layer 23 is not limited to the multi quantum well structure, but P can be introduced into the entire active layer, and an impurity introduced is not limited to P.

In addition, the active layer 23 preferably has n-type conductivity. Therefore, an n-type dopant is preferably introduced into the active layer 23. The concentration of the n-type dopant in the active layer 23 is preferably lower than that in another n-type semiconductor layer. For example, the concentration of the n-type dopant in the active layer 23 is preferably $1 \times 10^{18}$ cm$^{-3}$ or less, and is desirably $1 \times 10^{15}$ cm$^{-3}$ or more. This is because a concentration of more than $1 \times 10^{18}$ cm$^{-3}$ makes the concentration of a Ga hole or an As hole in a semiconductor high, and therefore the binding energy of an adjacent <110> dumbbell is reduced to lower an effect of suppressing diffusion of an As interstitial atom. In addition, this is because a concentration of $1 \times 10^{15}$ cm$^{-3}$ or more is a sufficient amount for cancelling a compensation effect by a hole or a residual impurity.

Another semiconductor layer is formed of a semiconductor having a higher bandgap energy and a lower refractive index than the well layer in the active layer 23. The other semiconductor layer is preferably formed of a III-V group semiconductor containing As as a primary component, but may be formed of InP, for example.

P, N, Sb, or In can be introduced into all the semiconductor layers in the semiconductor laser element 20. However, P, N, Sb, or In may be introduced selectively into a portion where a dislocation loop is easily generated. For example, it is effective for suppressing generation of a dislocation loop to introduce P, N, Sb, or In selectively into a portion under the p-side electrode 27 in the p-type semiconductor layer 24, a portion near an interface between the buried layer 25 and the p-type semiconductor layer 24 in the p-type semiconductor layer 24, or the like. In addition, it is effective for suppressing generation of a dislocation loop to selectively make a portion where a dislocation loop is easily generated n-type conductive. As described above, even with slightly larger n-type conductivity than an intrinsic semiconductor, generation of a dislocation loop is suppressed. Therefore, even a p-type semiconductor layer in the semiconductor laser element 20 can suppress generation of a dislocation loop by forming a region having such weak n-type conductivity to have no influence on a function of the semiconductor laser element 20.

Third Embodiment

Figure 13:
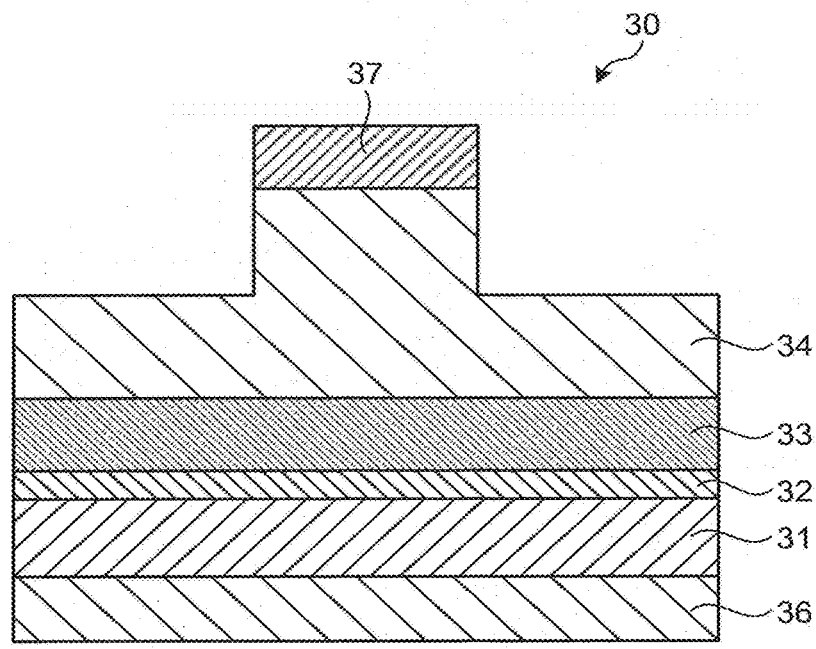
FIG. 13 is a schematic diagram illustrating a semiconductor device according to a third embodiment.

FIG. 13 is a schematic diagram illustrating a semiconductor device according to a third embodiment. The semiconductor device illustrated in FIG. 13 is a semiconductor laser element using a ridge structure. FIG. 13 is a cross sectional view parallel to an emitting surface of this semiconductor laser element.

As illustrated in FIG. 13, in a semiconductor laser element 30 according to the third embodiment, an n-type semiconductor layer 32, an active layer 33, and a p-type semiconductor layer 34 are stacked sequentially on a substrate 31. An upper portion of the p-type semiconductor layer 34 forms a ridge structure having a longitudinal direction in an emitting direction. The active layer 33 has a multi quantum well structure including a well layer and a barrier layer. In the semiconductor laser element 30, an impurity free vacancy disordering (IFVD) method which is an edge protection structure, for example, described in Japanese Laid-open Patent Publication No. 2012-146996, is applied to the active layer 33.

The ridge structure confines light generated by the active layer 33 in a lateral (width) direction due to a difference in thickness between the p-type semiconductor layers 34 serving as cladding layers. An n-side electrode 36 is formed on a back surface of the substrate 31. A A-side electrode 37 is formed on a front surface of the p-type semiconductor layer 34.

The well layer of the active layer 33 is formed of InGaAsP obtained by introducing P into InGaAs. Meanwhile, the barrier layer of the active layer 33 is formed of AlGaAs, and performs a function of a barrier for confining a carrier in the well layer. The active layer 33 is not limited to the above examples, but may be formed of another III-V group semiconductor containing As as a primary component. As in the first embodiment, in the present embodiment, the structure of the active layer 33 is not limited to the multi quantum well structure, but P can be introduced into the entire active layer, and an impurity introduced is not limited to P.

In addition, the active layer 33 preferably has n-type conductivity. Therefore, an n-type dopant is preferably introduced into the active layer 33. The concentration of the n-type dopant in the active layer 33 is preferably lower than that in another n-type semiconductor layer. For example, the concentration of the n-type dopant in the active layer 33 is preferably $1 \times 10^{18}$ cm$^{-3}$ or less, and is desirably $1 \times 10^{15}$ cm$^{-3}$ or more. This is because a concentration of more than $1 \times 10^{18}$ cm$^{-3}$ makes the concentration of a Ga hole or an As hole in a semiconductor high, and therefore the binding energy of an adjacent <110> dumbbell is reduced to lower an effect of suppressing diffusion of an As interstitial atom. In addition, this is because a concentration of $1 \times 10^{15}$ cm$^{-3}$ or more is a sufficient amount for cancelling a compensation effect by hole or a residual impurity.

Another semiconductor layer is formed of a semiconductor having a higher bandgap energy and a lower refractive index than the well layer in the active layer 33. The other semiconductor layer is preferably formed of a III-V group semiconductor containing As as a primary component, but may be formed of InP, for example.

P, N, Sb, or In can be introduced into all the semiconductor layers in the semiconductor laser element 30. However, P, N, Sb, or In may be introduced selectively into a portion where a dislocation loop is easily generated in addition to the active layer 33. For example, it is effective for suppressing generation of a dislocation loop to introduce P, N, Sb, or In selectively into a portion under the p-side electrode 37 in the p-type semiconductor layer 34, a rising portion of the ridge structure in the p-type semiconductor layer 34, or the like. In addition, it is effective for suppressing generation of a dislocation loop to selectively make a portion where a dislocation loop is easily generated n-type conductive. As described above, even with slightly larger n-type conductivity than an intrinsic semiconductor, generation of a dislocation loop is suppressed. Therefore, even a p-type semiconductor layer in the semiconductor laser element 30 can suppress generation of a dislocation loop by forming a region having such weak n-type conductivity to have no influence on a function of the semiconductor laser element 30. When the IFVD method is applied to a semiconductor laser element, a laser output of about 1 W or less suppresses a deterioration mode caused by an edge without addition of P, N, Sb, or the like. However, when a high output laser element having a width (stripe width) of 100 μm or more in a portion of the ridge structure and an optical power of about several tens W or more (CW driving condition) at one chip is manufactured, a dislocation loop is generated in a portion other than the edge to deteriorate characteristics.

Meanwhile, the IFVD method is applied to the semiconductor laser element 30, and P, N, Sb, or the like has been introduced into the active layer 33 or the like. Therefore, generation of a dislocation loop not only on the edge but also in the bulk is suppressed even under the CW driving condition in which the optical power is several tens W or more.

The present embodiment has been described using an example of a semiconductor laser element with a ridge structure. However, a proper modification example of the present embodiment can be formed easily also in a semiconductor laser element with a buried ridge structure, a semiconductor laser element with a high mesa ridge structure, or a semiconductor laser element with a self aligned structure (SAS).

Example 2

Example 2 has a structure obtained by embodying the third embodiment. Therefore, in the description of Example 2, FIG. 13 will be referred to like in the third embodiment. Description of a portion overlapping the description of the first embodiment will be omitted.

The semiconductor laser element 30 according to Example 2 is a so-called ridge laser element on a GaAs substrate. Therefore, the n-type semiconductor layer 32 formed, for example, of n-type AlGaAs, the active layer 33, and the p-type semiconductor layer 34 formed, for example, of p-type AlGaAs are stacked on the substrate 31 formed of GaAs. An upper portion of the p-type semiconductor layer 34 forms a ridge structure having a longitudinal direction in an emitting direction.

The active layer 33 has a single quantum well (SQW) structure obtained by sandwiching a well layer with barrier layers. For example, when the semiconductor laser element 30 is formed at a resonator width of 100 μm and a cavity length of 4 mm, an optical power of about 12 W can be obtained at one chip at a driving (rated) current of 12 A.

The thicknesses of the well layer and the barrier layer are 10 nm and 30 nm, respectively. P is added to the active layer while the compositions of the well layer and the barrier layer are adjusted such that the oscillation wavelength is 910 nm.

Here, the compositions of the active layer 33 having different concentrations of P will be exemplified. In an example in which no P is added, the oscillation wavelength of 910 nm can be realized by making the well layer $In_{0.075}Ga_{0.925}As$ and making the barrier layer $Al_{0.32}Ga_{0.68}As$. In an example of an active layer having P added at a concentration of 3%, the oscillation wavelength of 910 nm can be realized by making the well layer $In_{0.1}Ga_{0.9}As_{0.97}P_{0.03}$ and making the barrier layer $Al_{0.31}Ga_{0.69}As_{0.97}P_{0.03}$. In this way, the concentration of P added such that the wavelength is constant by adjusting the composition of a III group is changed within a range of 0.02 to 10%.

Initial characteristics are evaluated for a semiconductor laser element in which the concentration of P added as described above is changed within a range of 0.02 to 10%. Here, the initial characteristics are evaluated using a maximum slope efficiency at room temperature (25° C.)

In a case of a semiconductor laser element having a concentration of 3% or less of P added, including a case where no P is added, any semiconductor laser element has a slope efficiency of 1.01 to 1.02 W/A and obtains excellent initial characteristics. Meanwhile, in a case of a semiconductor laser element having a concentration of 5% of P in an active layer, the slope efficiency is reduced to about 1 W/A. In a case of a semiconductor laser element having a concentration of 10% of P added, the slope efficiency is reduced to 0.9 W/A.

Therefore, a semiconductor laser element is preferably formed such that the concentration of P added to an active layer is 3% or less from a viewpoint of no deterioration of initial characteristics.

When electrification is performed at 20 A which is more than a rated current of a semiconductor laser element (environment temperature 25° C.), 10% of a semiconductor laser element having no P added to an active layer is broken. Meanwhile, about 8% of a semiconductor laser element having a concentration of 0.02% of P added to an active layer is broken. About 5% of a semiconductor laser element having a concentration of 0.1% of P added to an active layer is broken. Breakdown of the semiconductor laser element occurs from a laser edge.

This result is due to improvement of dispersibility of an As interstitial atom by addition of P to an active layer and prevention of progress of a dislocation generated near an edge when a current at a rated value or more flows.

An optical power of a semiconductor laser element was monitored while electrification was performed at a constant current of 12 A at an environment temperature of 25° C. Reduction in the optical power is observed when more than 1000 hours have passed in a semiconductor laser element having no P added to an active layer. Meanwhile, reduction in the optical power is not observed before 2000 hours have passed in a semiconductor laser element having a concentration of 0.02% of P added to an active layer. Meanwhile, reduction in the optical power is not observed even after 2000 hours have passed in a semiconductor laser element having a concentration of 0.1% or more of P added to an active layer.

This result means that addition of P to an active layer of a semiconductor laser element improves dispersibility of an As interstitial atom and does not form a dislocation loop in the active layer or near an edge.

Example 3

Example 3 is obtained by changing the composition of the active layer in the structure of Example 2. Therefore, here, only the composition of the active layer will be described, and description of other constituent elements will be omitted.

The active layer in Example 3 includes Al in a well layer and includes In in a barrier layer. In an example of an active layer having P added at a concentration of 3%, the oscillation wavelength of 910 nm is realized by making the well layer $Al_{0.05}In_{0.15}Ga_{0.8}As_{0.97}P_{0.03}$ and making the barrier layer $Al_{0.35}In_{0.05}Ga_{0.6}As_{0.97}P_{0.03}$. Similarly, the concentration of P added such that the wavelength is constant by adjusting the composition of a III group is changed within a range of 0.02 to 10%.

Also in Example 3, initial characteristics are evaluated similarly at room temperature (25° C.). In a case of a semiconductor laser element having a concentration of 3% or less of P added, including a case where no P is added, any semiconductor laser element has a slope efficiency of 1.01 to 1.02 W/A and obtains excellent initial characteristics. That is, there is no significant difference in a value of initial characteristics at 25° C. between Examples 2 and 3.

Meanwhile, a value of initial characteristics at 50° C. in the semiconductor laser element in Example 3 is better than that in Example 2. That is, the slope efficiency of the semiconductor laser element in Example 3 is improved by about 5% compared to that in Example 2. It is considered that this is because a difference in electron affinity is generated due to a difference in the composition of a III group between the well layer and the barrier layer in Examples 2 and 3 although the bandgaps thereof are designed to be the same. The difference in the well layer is 15 meV, and the difference in the barrier layer is 19 meV. As a result, it is considered that leakage of a carrier from the well layer at a high temperature is suppressed and the slope efficiency is improved in Example 3.

In Examples 2 and 3, the semiconductor laser element having an oscillation wavelength of 910 nm has been exemplified. However, when the oscillation wavelength is changed, the composition of a III group element is only required to be changed appropriately. For example, when a semiconductor laser element having an oscillation wavelength of 975 nm is formed, the well layer of the active layer is only required to be $Al_{0.05}In_{0.25}Ga_{0.7}As_{0.97}P_{0.03}$, and the barrier layer is only required to be $Al_{0.35}In_{0.05}Ga_{0.6}As_{0.97}P_{0.03}$.

Fourth Embodiment

Figure 14:
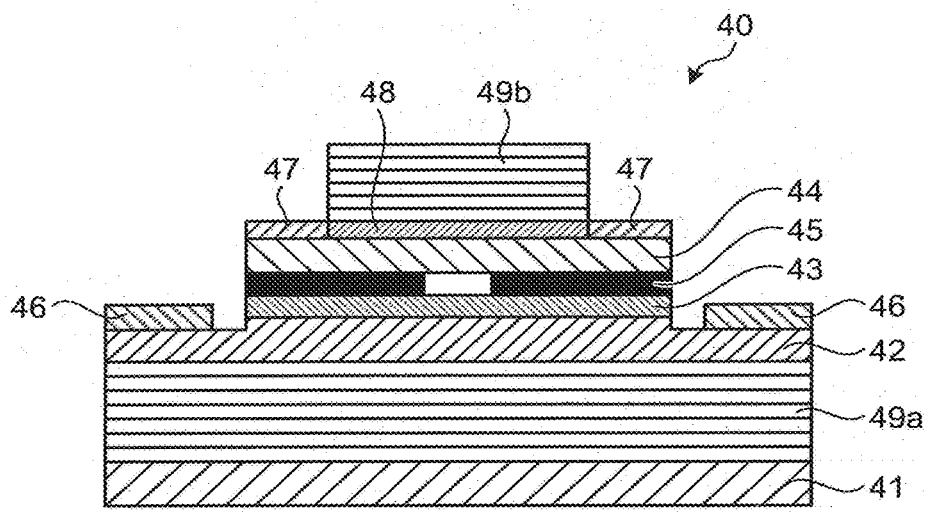
FIG. 14 is a schematic diagram illustrating a semiconductor device according to a fourth embodiment.

FIG. 14 is a schematic diagram illustrating a semiconductor device according to a fourth embodiment. The semiconductor device illustrated in FIG. 14 is a vertical cavity surface emitting laser (VCSEL) type semiconductor laser element (hereinafter, referred to as vertical cavity surface emitting laser element). FIG. 14 is a cross sectional view regarding an emitting direction of this semiconductor laser element.

As illustrated in FIG. 14, in a vertical cavity surface emitting laser element 40, a lower DBR mirror 49a stacked on a substrate 41, an n-type semiconductor layer 42, an active layer 43, a current confining layer 45, a p-type semiconductor layer 44, a phase adjusting layer 48, and an upper DBR mirror 49b are stacked sequentially. As illustrated in FIG. 14, an upper end of the n-type semiconductor layer 42, the active layer 43, the current confining layer 45, and the p-type semiconductor layer 44 are formed as a mesa post molded into a columnar shape by an etching treatment or the like. An n-side electrode 46 is disposed on a surface of the n-type semiconductor layer 42 exposed due to formation as a mesa post. A p-side electrode 47 is disposed in a ring shape so as to surround the phase adjusting layer 48 on a surface of the p-type semiconductor layer 44 at an upper end of the mesa post.

The lower DBR mirror 49a is formed as a semiconductor multilayer film mirror obtained by stacking a plurality of composite semiconductor layers formed, for example, of AlAs/GaAs. The thickness of each layer constituting this composite semiconductor layer is $\lambda/4n$ ($\lambda$: oscillation wavelength, n: refractive index). Meanwhile, the upper DBR mirror 49b is formed as a dielectric multilayer film mirror obtained by stacking a plurality of composite dielectric layers formed, for example, of $SiN/SiO_2$. The thickness of each layer thereof is $\lambda/4n$ similarly to the lower DBR mirror 49a.

The current confining layer 45 includes an opening portion and an oxidized confining portion. The current confining layer 45 is formed by an Al-containing layer formed, for example, of AlAs. An oxidized confining portion is formed by oxidization of only a predetermined range of the Al-containing layer from an external periphery. The oxidized confining portion has an insulating property, and increases a current density in the active layer 43 by confining a current injected from the p-side electrode 47 and concentrating the current in the opening portion.

The active layer 43 has a multi quantum well structure including a well layer and a barrier layer, and emits emission light based on the current injected from the p-side electrode 47 and confined by the current confining layer 45. This emission light resonates in a direction perpendicular to layers including the active layer 43 between the lower DBR mirror 49a and the upper DBR mirror 49b as resonators, is amplified, and then is emitted as laser light from an upper surface of the upper DBR mirror 49b. The phase adjusting layer 48 disposed between the p-type semiconductor layer 44 and the upper DBR mirror 49b serves to adjust positions of an antinode and a node of a standing wave of the laser light, formed in the resonator.

The well layer of the active layer 43 is formed of $InGaAs_{0.99}P_{0.01}$ obtained by introducing P into InGaAs. Meanwhile, the barrier layer of the active layer 43 is formed of AlGaAs, and performs a function of a barrier for confining a carrier in the well layer The active layer 43 is not limited to the above examples, but may be formed of another III-V group semiconductor containing As as a primary component. As in the first embodiment, in the present embodiment, the structure of the active layer 43 is not limited to the multi quantum well structure, but P can be introduced into the entire active layer, and an impurity introduced is not limited to P.

In addition, the active layer 43 preferably has n-type conductivity. Therefore, an n-type dopant is preferably introduced into the active layer 43. Examples of the n-type dopant include Se, S, and Si. The concentration of the n-type dopant in the active layer 43 is preferably lower than that in another n-type semiconductor layer. For example, the concentration of the n-type dopant in the active layer 43 is preferably $1 \times 10^{18}$ cm$^{-3}$ or less. When the concentration of the n-type dopant is $1 \times 10^{15}$ cm$^{-3}$ or more, generation of a dislocation loop is reduced significantly. This is because a concentration of more than $1 \times 10^{18}$ cm$^{-3}$ makes the concentration of a Ga hole or an As hole in a semiconductor high, and therefore the binding energy of an adjacent <110> dumbbell is reduced to lower an effect of suppressing diffusion of an As interstitial atom. In addition, this is because a concentration of $1 \times 10^{15}$ cm$^{-3}$ or more is a sufficient amount for cancelling a compensation effect by a hole or a residual impurity.

Fifth Embodiment

Figure 15:
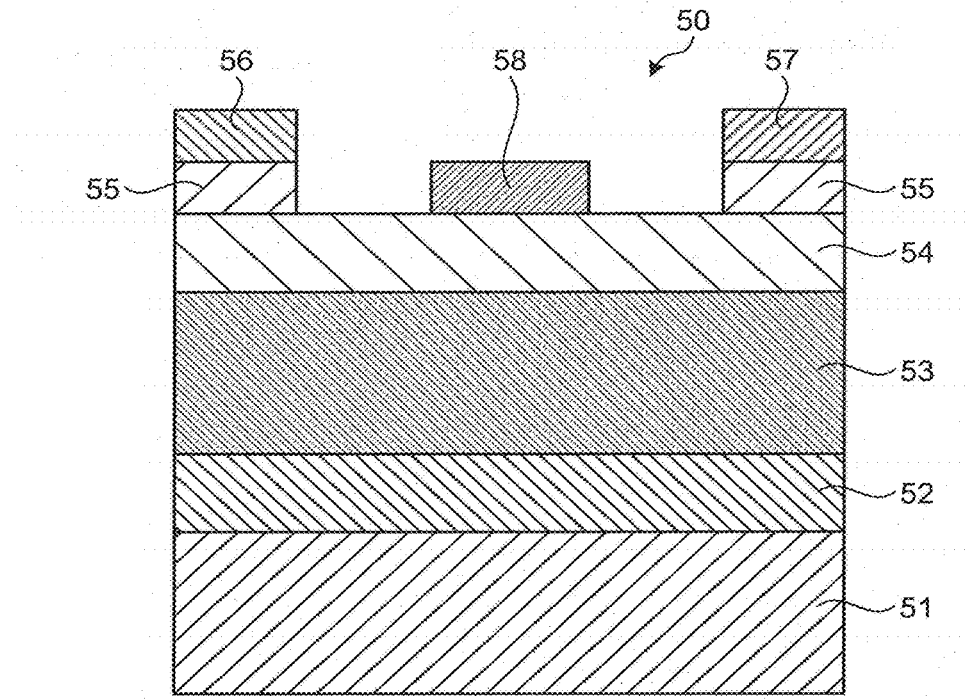
FIG. 15 is a schematic diagram illustrating a semiconductor device according to a fifth embodiment.

FIG. 15 is a schematic diagram illustrating a semiconductor device according to a fifth embodiment. The semiconductor device illustrated in FIG. 15 is a heterojunction transistor (HFET). FIG. 15 is a cross sectional view traversing each electrode of this heterojunction transistor.

As illustrated in FIG. 15, a heterojunction transistor 50 is formed by sequentially stacking a substrate 51 formed of semi-insulating GaAs, a buffer layer 52 formed of undoped GaAs for relaxing lattice mismatch formed on the substrate 51 and having a thickness of 1 μm, an electron transit layer 53 formed of undoped $GaAs_{0.99}P_{0.01}$ and having a thickness of 100 nm, an electron supply layer 54 formed of $Al_{0.3}Ga_{0.7}As$ doped with Si which is an n-type impurity, and a contact layer 55 formed of $n^+$ type GaAs and having a thickness of 100 nm. As described above, P has been introduced into the electron transit layer 53, but a similar effect is obtained by introduction of Sb, N, or In in addition to P. The electron transit layer 53 may be doped with In and P at the same time.

A source electrode 56 and a drain electrode 57 are formed on the contact layer 55. The contact layer 55 is etched to such a depth that a surface of the electron supply layer 54 is exposed in a region between the source electrode 56 and the drain electrode 57 to form a gate electrode 58. A two-dimensional electron gas is present in an interface of $AlGaAs/GaAs_{0.99}P_{0.01}$ due to the above structure. Therefore, a transistor having a high mobility is obtained.

An outline of a method for manufacturing the heterojunction transistor 50 having the above structure is as follows.

First, the buffer layer 52, the electron transit layer 53, the electron supply layer 54, and the contact layer 55 are sequentially grown epitaxially on the substrate 51 to form an epitaxial layer using a MOCVD method, a MBE method, or the like.

Subsequently, a pattern is formed using a photoresist to protect a predetermined position. The epitaxial layer is subjected to wet etching using a mixed solution, for example, of phosphoric acid, hydrogen peroxide water, and water. The contact layer 55 is removed to expose the surface of the electron supply layer 54 and form a gate electrode forming portion.

Subsequently, the photoresist is removed, and then a pattern is formed using a new photoresist. An ohmic metal formed of a Ni/AuGe alloy is deposited and is lifted off to form the source electrode 56 and the drain electrode 57. With the same photolithography step, a gate electrode 58 formed of Ti/Pt/Au is formed on the surface of the electron supply layer 54. In this way, the heterojunction transistor 50 having the above structure is manufactured.

The heterojunction transistor 50 having the above structure has better long-term reliability than a heterojunction transistor having a conventional structure. Specifically, sequential increase in on-resistance is suppressed, and element lifetime is extended. This is because P has been introduced into the electron transit layer 53 in the heterojunction transistor 50. An As interstitial atom is easily diffused due to heat generated during electrification of the heterojunction transistor 50 or electric field concentration between a gate and a drain during cut-off. However, P has been introduced into the electron transit layer 53, and therefore diffusion of the As interstitial atom is suppressed, and an As cluster is not formed. As a result, generation of a dislocation loop is suppressed.

The composition of P in GaAsP of the electron transit layer 53 is preferably from 0.01 to 5%. The concentration of an As interstitial atom generated when an electric field stress applied to an element is high and variation of characteristics starts to be generated is about $1\times10^{19}$ $cm^{-3}$ Therefore, a state in which the P concentration is higher than the concentration of this As interstitial atom (for example, 0.01% or more) increases a possibility for forming a <110> dumbbell.

Sixth Embodiment

Figure 16:
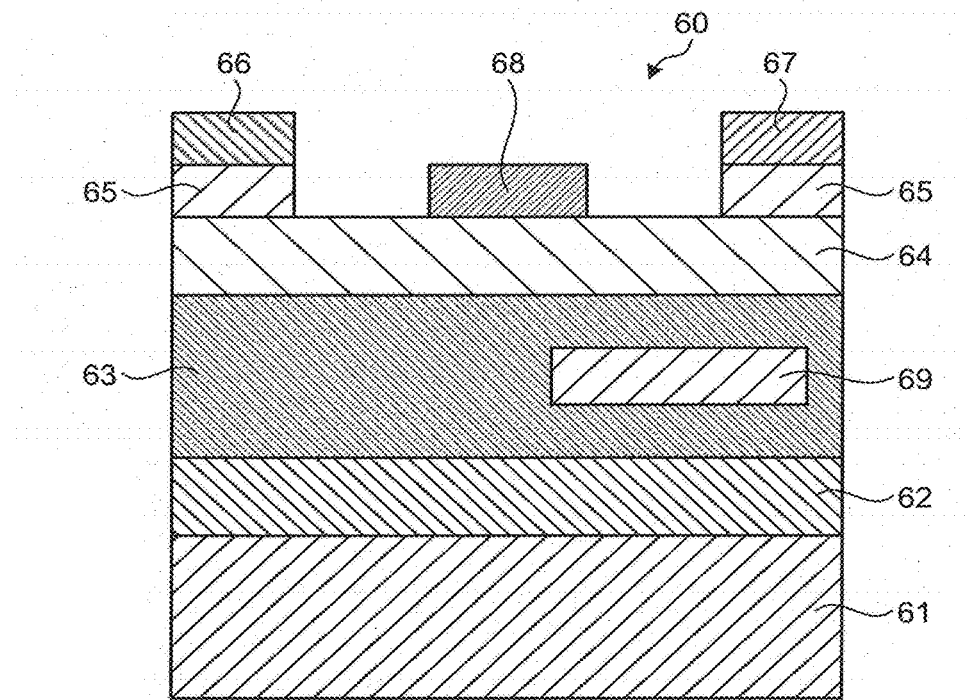
FIG. 16 is a schematic diagram illustrating a semiconductor device according to a sixth embodiment.

FIG. 16 is a schematic diagram illustrating a semiconductor device according to a sixth embodiment. The semiconductor device illustrated in FIG. 16 is a heterojunction transistor (HFET), and is a modification example of the fifth embodiment. FIG. 16 is a cross sectional view traversing each electrode of this heterojunction transistor. The present embodiment is a modification example of the fifth embodiment. Therefore, only a difference from the fifth embodiment will be described below.

As illustrated in FIG. 16, a heterojunction transistor 60 is formed by sequentially stacking a substrate 61 formed of semi-insulating GaAs, a buffer layer 62 formed of undoped GaAs for relaxing lattice mismatch formed on the substrate 61 and having a thickness of 1 μm, an electron transit layer 63 formed of undoped $GaAs_{0.99}P_{0.01}$ and having a thickness of 100 nm, an electricity supply layer 64 formed of $Al_{0.3}Ga_{0.7}As$ doped with Si which is an n-type impurity, and a contact layer 65 formed of $n^+$ type GaAs and having a thickness of 100 nm.

Furthermore, as illustrated in FIG. 16, a partial n-type layer 69 formed of $GaAs_{0.99}P_{0.01}$ and having $n^-$-type conductivity is formed in a part of the electron transit layer 63. The partial n-type layer 69 is only required to be formed, for example, in a thickness of 30 nm in the middle of the electron transit layer 63, for example, in a thickness (longitudinal) direction of the epitaxial layer. The partial n-type layer 69 is only required to be formed in a lower portion between a gate and a drain in which the electric field concentration occurs easily and the concentration of an As interstitial atom is high in a lateral direction. The partial n-type layer 69 is only required to be formed by selective growing or an ion injection method.

The concentration of the n-type dopant in the partial n-type layer 69 is preferably lower than that in another n-type semiconductor layer. For example, the concentration of the n-type dopant in the partial n-type layer 69 is preferably $1\times10^{18}$ $cm^{-3}$ or less, and an effect thereof is significant when the concentration is $1\times10^{15}$ $cm^{-3}$ or more. This is because a concentration of more than $1\times10^{18}$ $cm^{-3}$ makes the concentration of a Ga hole or an As hole in a semiconductor high, and therefore the binding energy of an adjacent <110> dumbbell is reduced to lower an effect of suppressing diffusion of an As interstitial atom. In addition, this is because a concentration of $1\times10^{15}$ $cm^{-3}$ or more is a sufficient amount for cancelling a compensation effect by a hole or a residual impurity.

The heterojunction transistor 60 provided with the partial n-type layer 69 at such a position as described above can suppress variation of characteristics caused by diffusion because a diffusion barrier of an As interstitial atom near a position where the As interstitial atom is generated is high.

Seventh Embodiment

Figure 17:
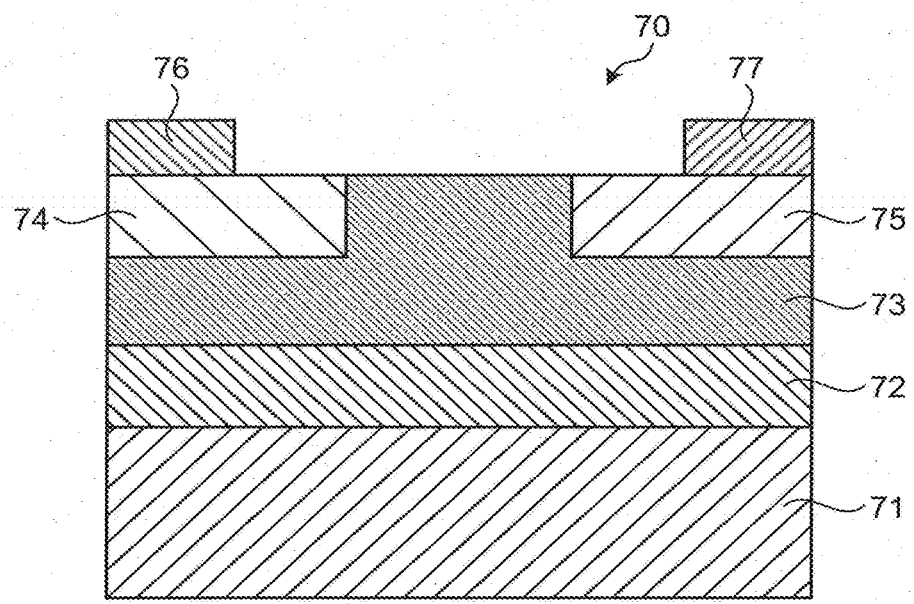
FIG. 17 is a schematic diagram illustrating a semiconductor device according to a seventh embodiment.

FIG. 17 is a schematic diagram illustrating a semiconductor device according to a seventh embodiment. The semiconductor device illustrated in FIG. 17 is a PIN diode for detecting radiation. FIG. 17 is a cross sectional view traversing each electrode of this PIN diode.

As illustrated in FIG. 17, a PIN diode 70 includes a substrate 71, a buffer layer 72 formed on the substrate 71, an i-type (intrinsic) layer 73 formed on the buffer layer 72, a p-type layer 74 and an n-type layer 75 formed in the i-type layer 73, an anode electrode 76 formed on the p-type layer 74, and a cathode electrode 77 formed on the n-type layer 75.

The substrate 71 is formed of semi-insulating GaAs. The buffer layer 72 is formed of undoped GaAs having a thickness of 1 μm, and serves for relaxing lattice mismatch. The i-type layer 73 is an i-type semiconductor layer formed of $GaAs_{0.99}P_{0.01}$ obtained by introducing P into GaAs and having a thickness of 1 μm.

The p-type layer 74 and the n-type layer 75 are a p-type semiconductor layer and an n-type semiconductor layer formed by subjecting GaAs, for example, to ion injection, selective growing, or thermal diffusion, respectively. The anode electrode 76 can be Ti/Pt/Au. The cathode electrode 77 can be Ni/Au. A distance between the anode electrode and the cathode electrode is, for example, 10 μm.

In the PIN diode 70, when a reverse voltage is applied to the anode electrode 76 and the cathode electrode 77, a depletion layer is spread in the i-type layer 73. When radiation is incident on this depletion layer, an electron-hole pair is formed along a path of the radiation. By use of the PIN diode 70, radiation can be detected by detecting a pulse current generated at this time.

The detection sensitivity of radiation is proportional to the fifth power of the atomic number and the density. Therefore, the sensitivity of 100 times or more a PIN diode with Si is realized by forming a PIN diode with GaAs, and the sensitivity is comparable to a Ge detector. In addition, the bandgap of GaAs is larger than that of Si. Therefore, this is advantageous to a Ge detector which should operate stably at room temperature and use liquid nitrogen. The mobility of GaAs at room temperature is about 8000 $cm^2$/Vs. A response rate of five times that of Si can be expected.

In a conventional PIN diode using GaAs for an i-type layer, a high electric field of 1/10 or more of 0.4 MV/cm which is a dielectric breakdown electric field of GaAs is applied to expand a depletion layer. Therefore, an As interstitial atom is formed easily. As a result, a dislocation loop is generated, and an element may be broken disadvantageously. However, in the PIN diode of the present embodiment, P has been introduced into the i-type layer serving as an undoped layer. Therefore, a <110> dumbbell is formed easily, and diffusion of an As interstitial atom is suppressed. Therefore, even when the operation condition is the same as that of the conventional PIN diode, the lifetime of an element is extended. In addition, even when being irradiated with radiation having a higher dose rate, the PIN diode of the present embodiment operates stably. A similar effect is obtained by introduction of Sb, N, or In in addition to P.

In the i-type layer 73 of the present embodiment, P has been introduced into GaAs. However, P is a V group element, and therefore has no influence on conductivity. In other words, a p-type dopant has not been intentionally added to the i-type layer 73 of the present embodiment. Therefore, the i-type layer 73 corresponds to a region of a Fermi energy of about 0.5 eV in FIG. 7, and a state in which a <110> dumbbell is formed is realized rather than single presence of an As interstitial atom.

The concentration of a P element in the V group elements is preferably from 0.1 to 5% in the i-type layer 73. This is because a concentration of 0.1% or more makes an effect of forming a <110> dumbbell high, and a concentration of 5% or less has a small influence by reduction in detection sensitivity of radiation or reduction in mobility.

Eighth Embodiment

Figure 18:
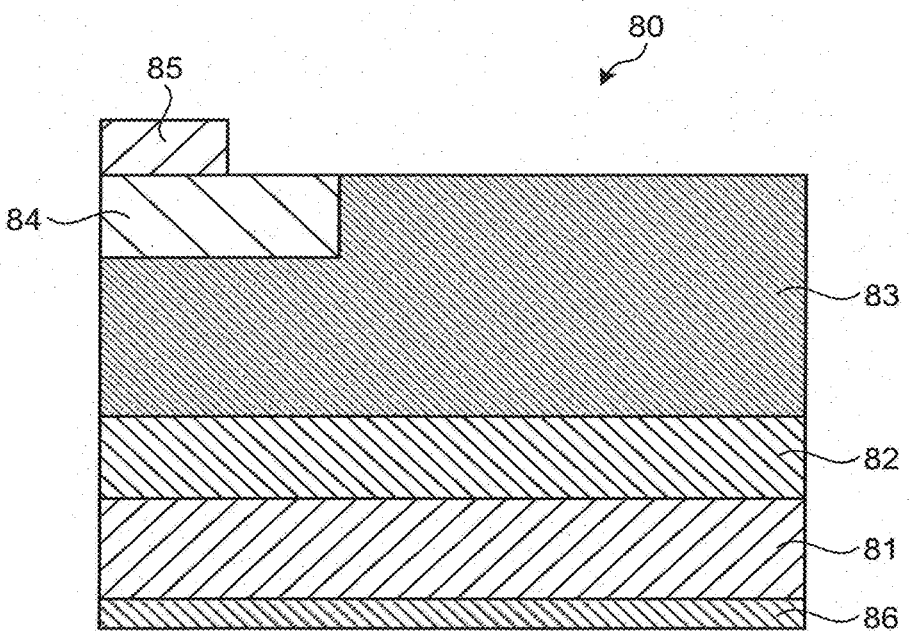
FIG. 18 is a schematic diagram illustrating a semiconductor device according to an eighth embodiment.

FIG. 18 is a schematic diagram illustrating a semiconductor device according to an eighth embodiment. The semiconductor device illustrated in FIG. 18 is a longitudinal PIN diode for detecting radiation. FIG. 18 is a cross sectional view traversing each electrode of this longitudinal PIN diode.

As illustrated in FIG. 18, a longitudinal PIN diode 80 includes a substrate 81, a buffer layer 82 formed on the substrate 81, an i-type layer 83 formed on the buffer layer 82, a p-type layer 84 formed in the i-type layer 83, an anode electrode 85 formed on the p-type layer 84, and a cathode electrode 86 formed on the back surface of the substrate 81.

The substrate 81 is formed of GaAs having n-type conductivity. The buffer layer 82 is formed of GaAs having n-type conductivity and a thickness of 1 μm, and serves for relaxing lattice mismatch. The i-type layer 83 is an i-type semiconductor layer formed of $GaAs_{0.99}P_{0.005}$ obtained by introducing P into GaAs and having a thickness of 100 The i-type layer 83 includes the p-GaAs layer 84 formed in the i-GaAsP layer 83. The anode electrode 85 is formed on the p-GaAs layer 84. The cathode electrode 86 is formed on the back surface of the substrate 81.

The p-type layer 84 is a p-type semiconductor layer formed by subjecting GaAs, for example, to ion injection, selective growing, or thermal diffusion. The anode electrode 85 can be Ti/Pt/Au. The cathode electrode 86 can be Ni/Au.

Figure 19:
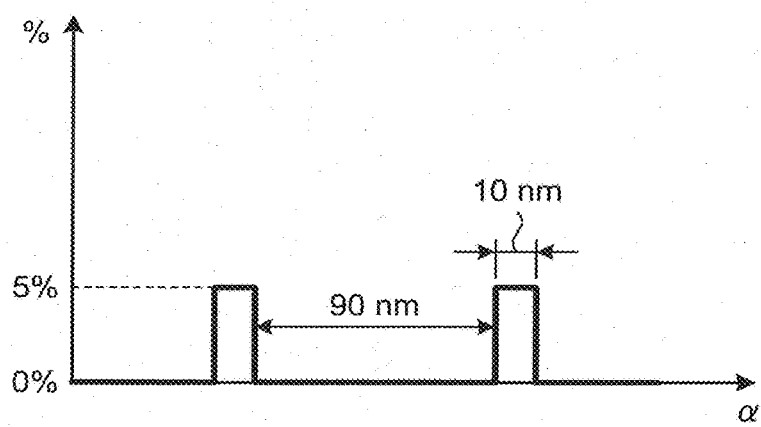
FIG. 19 is a diagram exemplifying digital introduction of a P atom.

In the present embodiment, P is introduced uniformly into the i-type layer 83 which is an undoped layer, and the ratio of the composition is 0.005. However, as illustrated in FIG. 19, a P atom may be introduced digitally. FIG. 19 illustrates a growing direction (thickness direction) of the i-type layer and a P concentration at the position. A position of a P concentration of 0% corresponds to GaAs. In an example illustrated in FIG. 19, an undoped layer is formed by stacking a GaAsP layer having a composition of 0.05 and a thickness of 10 nm and a GaAs layer having a composition of 0.05 and a thickness of 90 nm alternately and repeatedly.

By forming a GaAsP layer digitally, a region having a high P concentration can be formed locally. In the region having a high P concentration, a <110> dumbbell is formed at a position where a plurality of P atoms are present, the formation energy is reduced, and the binding energy is increased. Therefore, an effect of suppressing diffusion of an As interstitial atom is increased. In addition, when a GaAsP layer is formed digitally, generation of a misfit dislocation or a crack can be suppressed more and a crystal quality of an epitaxial film is better than a case where a GaAsP layer having a uniform concentration is stacked.

The thickness of the depletion layer of the longitudinal PIN diode 80 of the present embodiment can be ten times that of the PIN diode 70 of the seventh embodiment. Therefore, the sensitivity of radiation of the longitudinal PIN diode 80 can be about ten times that of the PIN diode 70. The cathode electrode 86 is present on the back surface of the substrate 81. Therefore, an element area can be made small, and accumulation of a two-dimensional detector or the like is easy advantageously. At the same time, in the longitudinal PIN diode 80 of the present embodiment, P has been introduced into the i-type layer. Therefore, a <110> dumbbell is formed easily, and diffusion of an As interstitial atom is suppressed. Therefore, the longitudinal PIN diode 80 of the present embodiment has better long-term reliability than a conventional PIN diode.

Hereinabove, the embodiments of the present disclosure have been described specifically. However, the present disclosure is not limited to the above embodiments, but various modifications can be made based on the technical idea of the present disclosure. For example, the numerical values indicated in the above embodiments are only examples, and numerical values different from these values may be used as necessary.

As described above, the semiconductor device according to the present disclosure is useful as a semiconductor device having less variation of characteristics.

A semiconductor device according to the present disclosure suppresses generation of defects in a bulk of a semiconductor crystal.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor device comprising:
   an active layer formed of a III-V group semiconductor crystal including As as a primary component of a V group, wherein
   a <110> dumbbell formed of As is formed in the active layer,
   the active layer is a quantum well structure layer including a well layer and a barrier layer, and
   P has been introduced at a concentration of 0.02 to 3% into a V group site of the III-V group semiconductor crystal in the well layer and the barrier layer to stabilize the <110> dumbbell.

2. The semiconductor device according to claim 1, wherein the active layer formed of the III-V group semiconductor crystal including As as the primary component of the V group, is any one of GaAs, AlGaAs, InGaAs, and AlGaInAs or a combination thereof, and the P has been introduced at the concentration of 0.02 to 3% into the V group site of the III-V group semiconductor crystal in the well layer and the barrier layer to stabilize the <110> dumbbell.

* * * * *